US011871581B2

(12) United States Patent
Cheng et al.

(10) Patent No.: US 11,871,581 B2
(45) Date of Patent: Jan. 9, 2024

(54) FERROELECTRIC MEMORY CELL

(71) Applicant: Taiwan Semiconductor Manufacturing Co., Ltd., Hsinchu (TW)

(72) Inventors: Chung-Liang Cheng, Changhua (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 198 days.

(21) Appl. No.: 17/472,479

(22) Filed: Sep. 10, 2021

(65) Prior Publication Data

US 2022/0310638 A1    Sep. 29, 2022

Related U.S. Application Data

(60) Provisional application No. 63/166,125, filed on Mar. 25, 2021.

(51) Int. Cl.
*H10B 53/20* (2023.01)
*H01L 29/423* (2006.01)
*H10B 51/20* (2023.01)
*H10B 53/00* (2023.01)
*H01L 23/528* (2006.01)
*H01L 23/522* (2006.01)
*H10B 51/10* (2023.01)
*H10B 53/10* (2023.01)

(52) U.S. Cl.
CPC ......... *H10B 53/20* (2023.02); *H01L 23/5226* (2013.01); *H01L 23/5283* (2013.01); *H01L 29/42392* (2013.01); *H10B 51/10* (2023.02); *H10B 51/20* (2023.02); *H10B 53/00* (2023.02); *H10B 53/10* (2023.02)

(58) Field of Classification Search
CPC ........ H10B 53/20; H10B 51/10; H10B 51/20; H10B 53/10; H10B 53/00; H01L 23/5226; H01L 29/42392; H01L 21/76897
See application file for complete search history.

(56) References Cited

U.S. PATENT DOCUMENTS

| | | | |
|---|---|---|---|
| 2021/0296396 A1* | 9/2021 | Wu | H10N 70/011 |
| 2022/0013353 A1* | 1/2022 | Lu | H01L 21/02472 |
| 2022/0139932 A1* | 5/2022 | Polakowski | H01L 29/78391 |
| | | | 257/295 |
| 2023/0065446 A1* | 3/2023 | Cheng | H01L 23/5223 |
| 2023/0068754 A1* | 3/2023 | Cheng | H10N 70/253 |

\* cited by examiner

*Primary Examiner* — David Vu
*Assistant Examiner* — Brandon C Fox
(74) *Attorney, Agent, or Firm* — Sterne, Kessler, Goldstein & Fox P.L.L.C.

(57) ABSTRACT

A ferroelectric memory cell (FeRAM) is disclosed that includes an active device (e.g., a transistor) and a passive device (e.g., a ferroelectric capacitor) integrated in a substrate. The transistor and its gate contacts are formed on a front side of the substrate. A carrier wafer can be bonded to the active device to allow the active device to be inverted so that the passive device and associated contacts can be electrically coupled from a back side of the substrate.

20 Claims, 23 Drawing Sheets

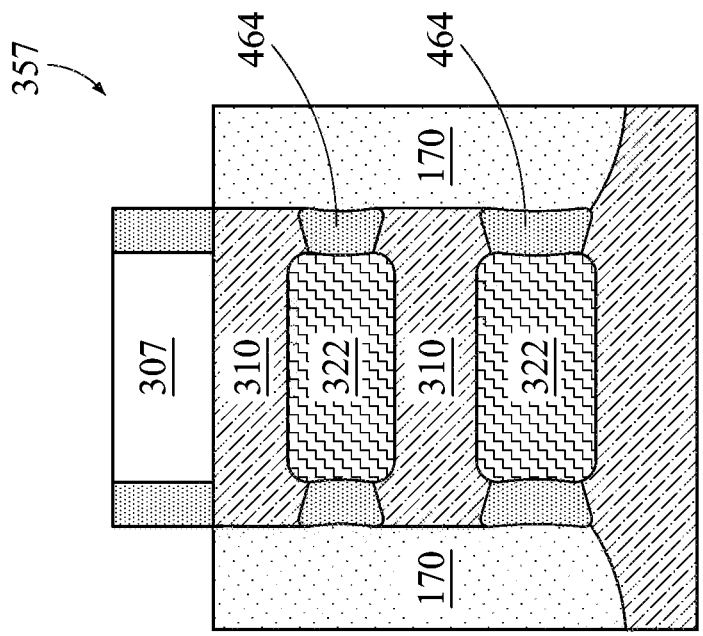
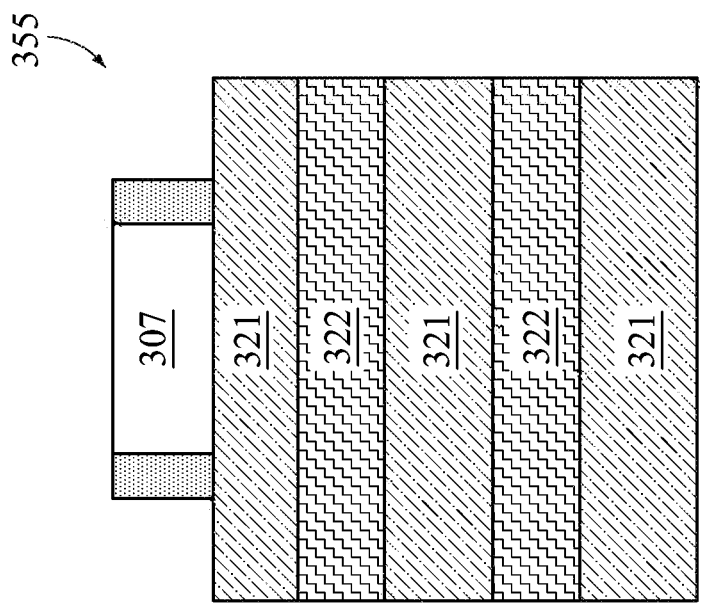
Fig. 4B
Fig. 4A

FERROELECTRIC MEMORY CELL

CROSS-REFERENCE TO RELATED APPLICATION

This patent application claims benefit of U.S. Provisional Patent Application No. 63/166,125, filed on Mar. 25, 2021 and titled "FinFET with Integrated Ferroelectric Memory Cell," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. Dimensions of the various features may be arbitrarily increased or reduced for clarity of discussion. In the figures, identical reference numerals identify similar features or elements.

Illustrative embodiments will now be described with reference to the accompanying drawings. In the drawings, like reference numerals generally indicate identical, functionally similar, and/or structurally similar elements.

DETAILED DESCRIPTION

Figure 1A:
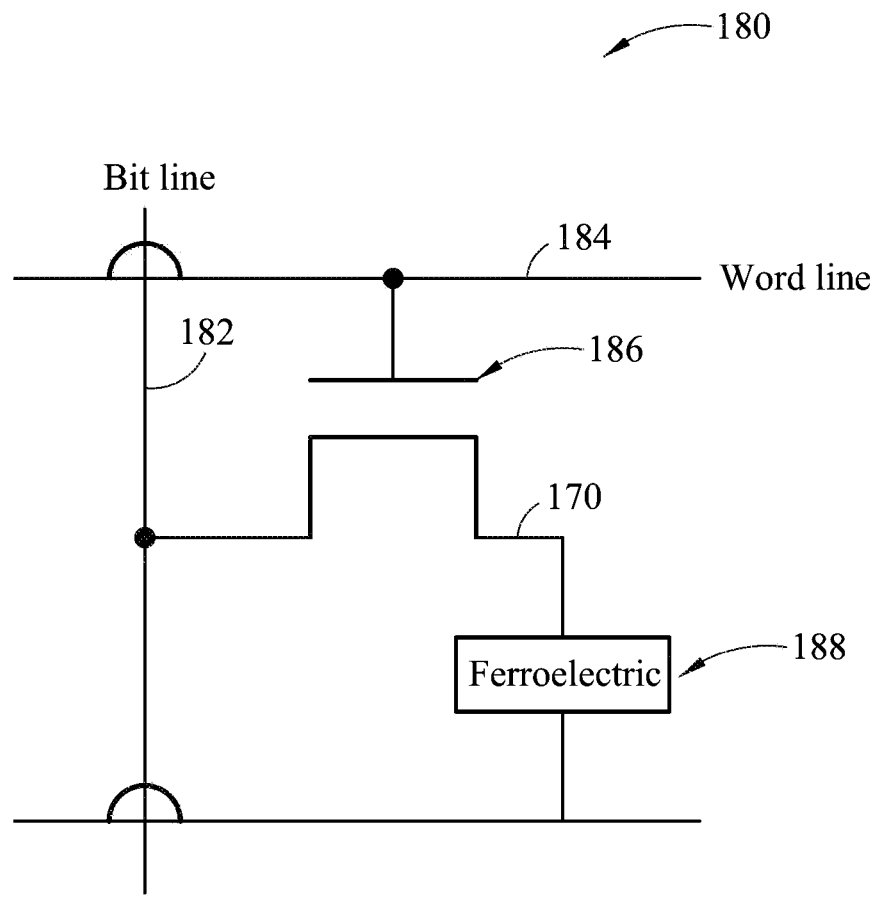
FIG. 1A is a circuit schematic of a ferroelectric memory cell (FeRAM) in the context of a memory array, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

Structures disclosed herein can be patterned by various methods. For example, the fin structures can be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is removed, and the remaining spacers can be used to pattern the fin structures.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

A structure that integrates logic with passive devices can be a desirable approach for improving performance and reducing cost. In the present disclosure, a backside ferroelectric capacitor is stacked on one or more field effect transistors (FETs) to form an integrated ferroelectric memory cell (e.g., a FeRAM). Incorporating ferroelectric capacitor into the backside of a semiconductor wafer in which transistors are already formed can simplify the overall fabrication process of the FeRAM.

FIG. 1A is a circuit schematic of a ferroelectric memory cell 180, in accordance with some embodiments. Ferroelectric memory cell 180 includes a transistor 186 coupled to a ferroelectric capacitor 188. Ferroelectric memory cell 180 is electrically addressable via a bit line 182 coupled to a source/drain region of transistor 186 and a word line 184 coupled to a gate terminal of transistor 186. Ferroelectric capacitor 188 is coupled to the other source/drain region of transistor 186. Multiple ferroelectric memory cells 180 can be arranged in rows and columns to form a ferroelectric memory array, in accordance with some embodiments.

Figure 1B:
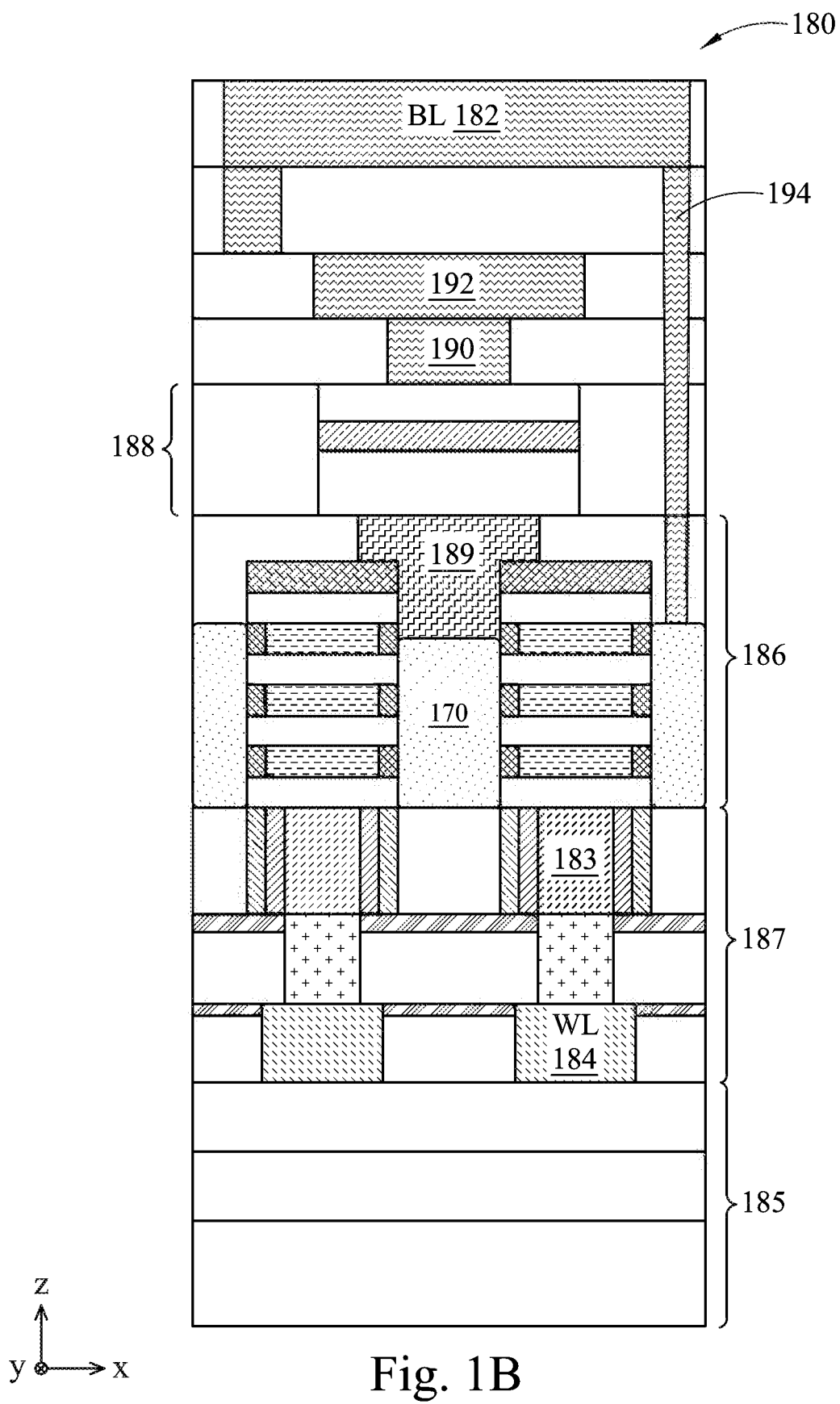
FIG. 1B is a cross-sectional view of the ferroelectric memory cell shown in FIG. 1A, in which the transistor is implemented as a gate all-around field effect transistor (GAAFET), in accordance with some embodiments.

FIG. 1B is a cross-section of ferroelectric memory cell 180 implemented as an integrated structure, in accordance with some embodiments. Ferroelectric memory cell 180 includes transistor 186, implemented as a gate-all-around FET (e.g., a nano-sheet GAAFET), and ferroelectric capacitor 188, implemented as a parallel plate capacitor stacked on top of transistor 186. Ferroelectric memory cell 180 further includes an interconnect structure 187 and a carrier substrate 185. Transistor 186 together with interconnect structure 187 can be considered as a transistor assembly (or transistor structure) that is supported by carrier substrate 185. In ferroelectric memory cell 180, transistor 186 overlies interconnect structure 187. Interconnect structure 187 couples word line 184 to gate contacts of transistor 186. Interconnect structure 187 can include more layers in addition to the exemplary layer(s) shown and described herein. A first, source/drain contact 189 couples ferroelectric capacitor 188 to a source/drain region 170 of transistor 186. Source/drain region 170 is accessible via bit line 182. A second, ground contact 190 couples ferroelectric capacitor 188 to ground via metallization 192. Thus, the wiring connections shown in FIG. 1A are replicated in the integrated structure of FIG. 1B.

Figure 2:
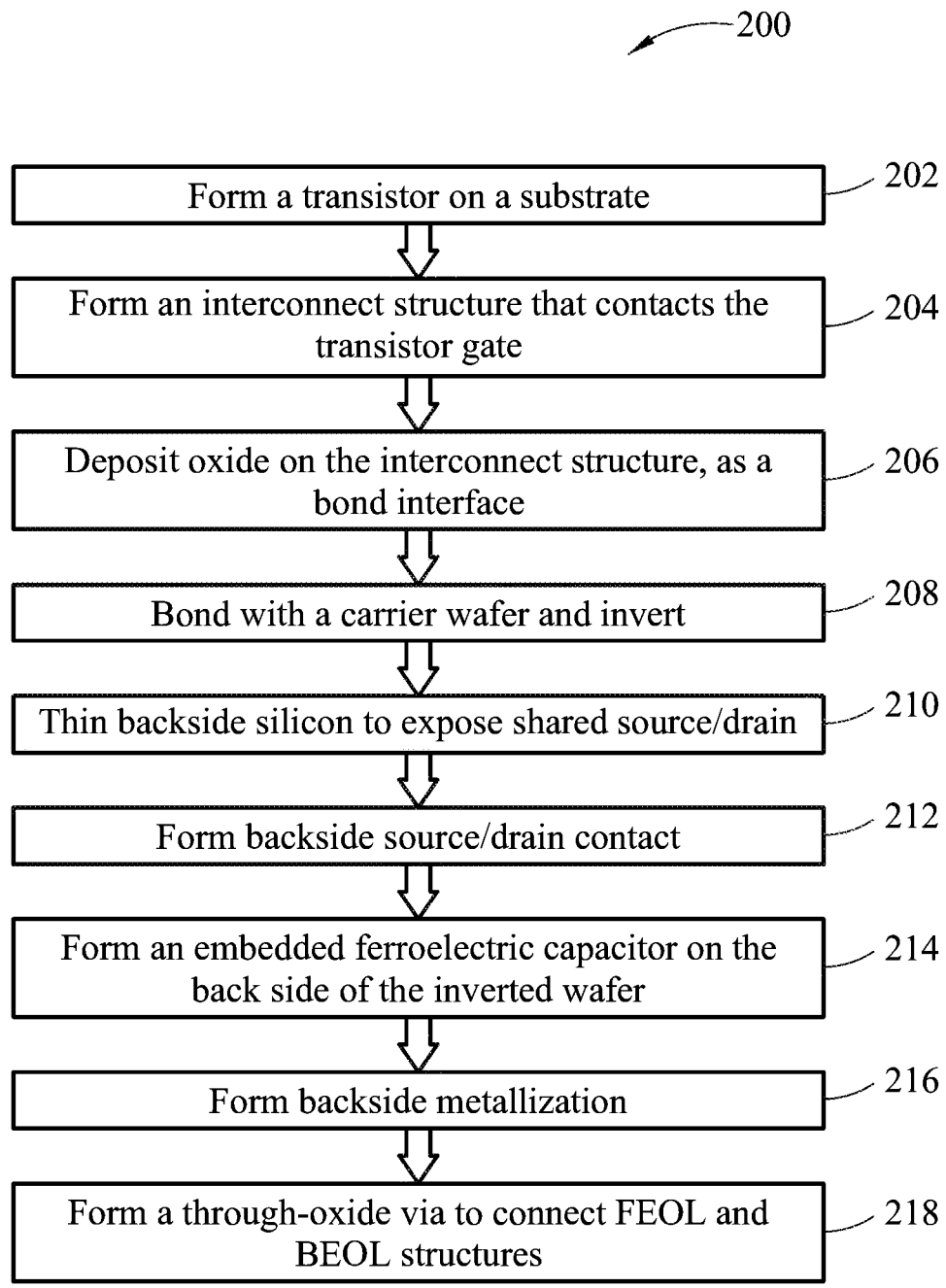
FIG. 2 is a flow diagram of a method for fabricating the ferroelectric memory cell shown in FIGS. 1A and 1B, in accordance with some embodiments.

FIG. 2 is a flow diagram of a method 200 for fabricating integrated ferroelectric memory cell 180 shown in FIGS. 1A and 1B, according to some embodiments. For illustrative purposes, operations illustrated in FIG. 2 will be described with reference to the exemplary process for fabricating ferroelectric memory cell 180, as illustrated in FIGS. 3A-10, which are cross-sectional views of ferroelectric memory cell 180 at various stages of its fabrication, according to some embodiments. Operations can be performed in a different order, or not performed, depending on specific applications. It is noted that method 200 may not produce a complete semiconductor device. Accordingly, it is understood that additional processes can be provided before, during, or after method 200, and that some of these additional processes may only be briefly described herein.

Referring to FIG. 2, in operation 202, transistors are formed on substrate 302. As shown in FIGS. 3A-5A, according to some embodiments, the transistors can be adjacent to one another. Transistor 186, shown in the circuit diagram in FIG. 1A, is one of the pair of adjacent transistors shown in FIG. 5A, for example, the right hand transistor. Although transistor 186 is described herein with respect to a nano-sheet GAAFET implementation, transistor 186 can be implemented as another type of transistor, such as a FinFET, a nanowire FET, and a planar FET.

Figure 3A:
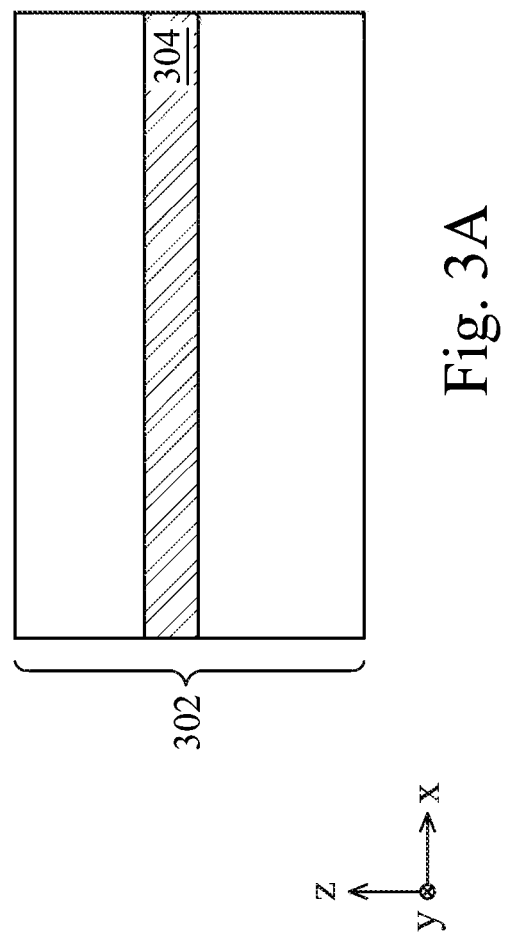
FIGS. 3A-11 are cross-sectional views of the ferroelectric memory cell shown in FIGS. 1A and 1B at various stages of its fabrication process, in accordance with some embodiments.

Transistor 186 can be formed on a substrate 302, as shown in FIG. 3A. Substrate 302, can be a silicon-on-insulator (SOI) substrate that includes a buried layer 304. Buried layer 304 can be, for example, a SiGe layer, a boron-doped SiGe layer, or an oxide layer. Buried layer 304 can have a thickness between about 90 mm and 310 mm. Substrate 302 can be formed by growing or depositing buried layer 304 on a semiconductor wafer (e.g., a silicon wafer), followed by growing or depositing a top silicon layer on buried layer 304. One or more of buried layer 304 and the top silicon layer can be formed epitaxially.

In some embodiments, substrate 302 can include (i) an elementary semiconductor, such as germanium; (ii) a compound semiconductor including silicon carbide (SiC), gallium arsenide (GaAs), gallium phosphide (GaP), indium phosphide (InP), indium arsenide (InAs), and/or indium antimonide; (iii) an alloy semiconductor including silicon germanium carbide (SiGeC), silicon germanium (SiGe), gallium arsenic phosphide (GaAsP), gallium indium phosphide (GaInP), gallium indium arsenide (GaInAs), gallium indium arsenic phosphide (GaInAsP), aluminum indium arsenide (AlInAs), and/or aluminum gallium arsenide (AlGaAs); or (iv) a combination thereof. Further, substrate 302 can be doped depending on design requirements (e.g., p-type substrate or n-type substrate). In some embodiments, substrate 302 can be doped with p-type dopants (e.g., boron, indium, aluminum, or gallium) or n-type dopants (e.g., phosphorus or arsenic). In some embodiments, substrate 302 can include a glass substrate. In some embodiments, substrate 302 can include a flexible substrate made of, for example, plastic. In some embodiments, substrate 302 can include a crystalline substrate, where a top surface of substrate 302 can be parallel to the (100), (310), (111), or c-plane (0001) crystal plane.

Figure 3C:
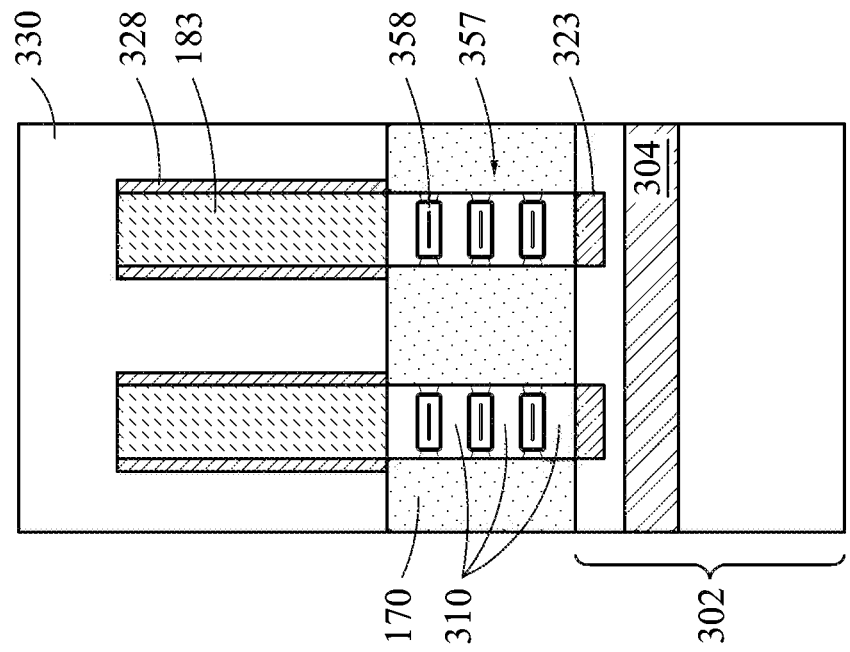
Figure 3B:
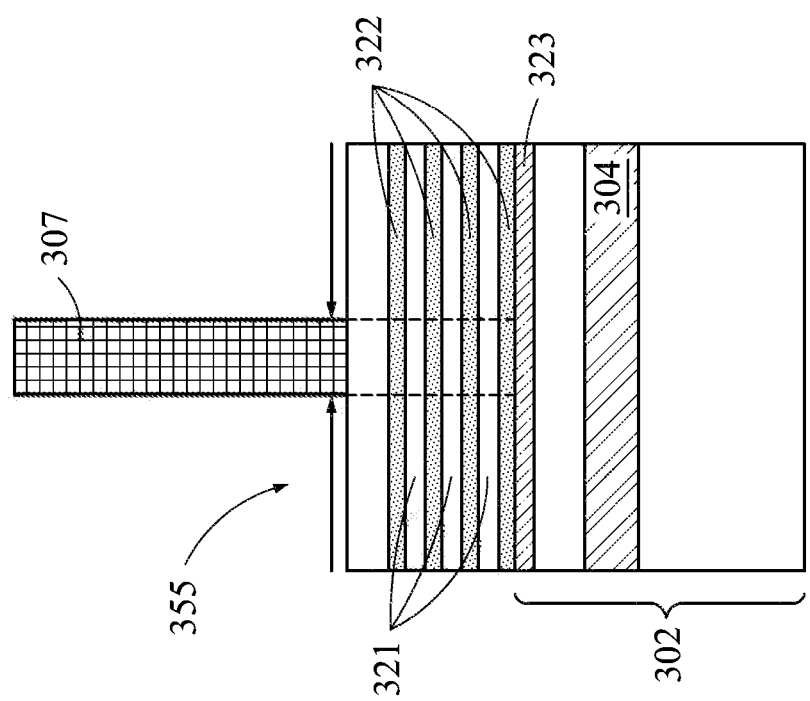

Referring to FIG. 2, in operation 202, transistor 186, implemented as a nano-sheet type GAAFET, is formed on substrate 302, as shown in FIGS. 3B-3C and 4A-4E, according to some embodiments. Referring to FIG. 3B, in some embodiments, a SiN layer 323 is formed on substrate 302. A superlattice 355 can be formed on SiN layer 323. Superlattice 355 can include a stack of nanostructured layers 321 and 322 arranged in an alternating configuration. In some embodiments, nanostructured layers 321 include materials similar to one another (e.g., epitaxial Si) and nanostructured layers 322 include materials similar to one another (e.g., epitaxial SiGe). In some embodiments, superlattice 355 is formed by etching a stack of two different semiconductor layers arranged in the alternating configuration. Nanostructured layers 322 will be replaced in subsequent processing, while nanostructured layers 321 will remain as part of transistor 186. Although FIG. 3B shows three nanostructured layers 321 and four nanostructured layers 322, any number of nanostructured layers can be included in superlattice 355. The alternating configuration of superlattice 355 can be achieved by alternating deposition, or epitaxial growth, of SiGe and Si layers, following deposition of the first SiGe or Si layer on SiN layer 323. Etching the Si layers can form nanostructured layers 321, which are interleaved with SiGe nanostructured layers 322. Each of nanostructured layers 321-322 can have thicknesses between about 1 nm and about 10 nm. In some embodiments, the topmost nanostructured layers (e.g., Si layers) of superlattice 355 can be thicker than the underlying nanostructured layers.

Superlattice 355, as a multi-layer stack of two different semiconductor materials, can be formed via an epitaxial growth process. The epitaxial growth process can include (i) chemical vapor deposition (CVD), such as low pressure CVD (LPCVD), rapid thermal chemical vapor deposition (RTCVD), metal-organic chemical vapor deposition (MOCVD), atomic layer CVD (ALCVD), ultrahigh vacuum CVD (UHVCVD), reduced pressure CVD (RPCVD), or another suitable CVD process; (ii) molecular beam epitaxy (MBE) processes (iii) another suitable epitaxial process; or (iv) a combination thereof. In some embodiments, source/drain regions can be grown by an epitaxial deposition/partial etch process, which repeats the epitaxial deposition/partial etch process at least once. Such repeated deposition/partial etch process is also called a "cyclic deposition-etch (CDE) process." In some embodiments, source/drain regions can be grown by selective epitaxial growth (SEG), where an etching gas can be added to promote selective growth on exposed semiconductor surfaces of substrate 302 or the fin, but not on insulating material.

Within superlattice 355, a doping type of the two different semiconductor layers can be determined by introducing one or more precursors during the epitaxial growth process. For example, the stacked semiconductor layers can be in-situ p-type doped during the epitaxial growth process using p-type doping precursors, such as diborane ($B_2H_6$) and boron trifluoride ($BF_3$). In some embodiments, the stack of two different semiconductor layers can be in-situ n-type doped during an epitaxial growth process using n-type doping precursors, such as phosphine ($PH_3$) and arsine ($AsH_3$).

Following the formation of superlattice 355, silicon substrate 302 can be etched to form a fin that provides structural support for superlattice 355, while allowing a formation of STI regions in substrate 302, between neighboring transistors.

Referring to FIG. 3B, a sacrificial structure 307 is formed around superlattice 355. Sacrificial structure 307 can be made of polysilicon and can include one or more sacrificial hard mask layers and a sidewall spacer 328 (omitted in the figure for simplicity). Sacrificial structure 307 can be deposited and patterned using the hard mask layer(s), which can be retained during additional processing or removed. Hard mask layers can be made of, for example, an oxide material or a silicon nitride (SiN) material that can be grown and/or deposited using an ALD process. Alternatively, the hard mask used to pattern sacrificial structure 307 can be deposited by any suitable method and can be patterned using a photoresist mask. Sidewall spacer 328 can be made of, for example, a SiN material that can be grown and/or deposited using an ALD process. Sacrificial structure 307 is replaced later in the fabrication process.

Next, superlattice 355 is removed in the source/drain regions, indicated by opposing arrows in FIG. 3B. Following the source/drain recess, nanostructured layers 321 and 322 remain under sacrificial structure 307 as indicated by dotted lines in FIG. 3B. Removal of superlattice 355 in the source/drain regions can be accomplished using, for example, a wet etch process that employs dilute hydrofluoric acid (DHF) and ammonium hydroxide-peroxide water mixture (APM). DHF can remove both silicon and SiGe nanostructured layers 321 and 322 outside the channel region, while the channel region is protected by hard mask and/or spacer layers of sacrificial structure 307. Such layers, if made of SiN, will not be substantially etched by DHF. Alternatively, a dry etch process can be used to remove superlattice 355 in the source/drain regions.

Referring to FIG. 3C, epitaxial source/drain regions are formed on either side of sacrificial structure 307. For example, source/drain regions 170 can be grown epitaxially from nanostructured layers 321 and/or 322 of superlattice 355 under sacrificial structure 307. Source/drain regions 170 can be made of SiGe, for example, having a germanium concentration profile that varies along the height of source/drain regions 170 from about 35% germanium at the top and bottom of source/drain regions 170 to about 50% to 65% germanium in the middle of source/drain regions 170. In contrast, germanium concentrations near the bottom of source/drain regions in some existing GAAFETs can be lower, e.g., about 25% germanium. Germanium concentration may affect doping profiles and consequently, electric potential in the source/drain region that can influence channel current. When the germanium concentration profile of source/drain regions 170 is outside the range of about 35%-65%, channel current can be outside a desired range for operation of transistor 186, when implemented as a GAAFET. Source/drain regions 170 can be independently formed by metalorganic CVD (MOCVD), molecular beam epitaxy (MBE), liquid phase epitaxy (LYE), vapor phase epitaxy (VPE), SEG, or a combination thereof. In addition, source/drain regions 170 can be independently doped by in-situ doping during epitaxial growth and/or by implantation after epitaxial growth.

Referring to FIG. 3C, an inter-layer dielectric (ILD) 330 is deposited. ILD 330 is an insulating layer that electrically insulates neighboring devices and electrical contacts from one another. ILD 330 can be made of a silicon oxide, for example. ILD 330 can be deposited using a CVD or plasma enhanced CVD (PECVD) process, for example.

Following the formation of ILD 330, sacrificial structure 307 is removed and replaced with a metal gate structure that forms gate terminal 183 (or gate structure 183) as described with respect to FIGS. 4A-4E, resulting in the transistor. During the replacement metal gate process, nanostructured layers 322 are also selectively removed to form gate openings in the channel region. The gate openings are filled with metal by depositing gate structure 183, to form GAA channel region 357, as shown in FIG. 3C. The remaining nanostructured layers 321 of superlattice 355 form nanostructured channels 310 of transistor 186, and a neighboring transistor that shares a source/drain region with transistor 186. Each of GAA channel regions 357 can include GAA structures 358 (three shown in FIG. 3C).

FIGS. 4A-4E are magnified views showing operations for forming gate structure 183 and GAA channel region 357 shown in FIG. 3C, according to some embodiments. GAA channel region 357 includes multiple GAA structures 358, which surround channels 310 to control current flow therein.

FIG. 4A is a magnified cross-sectional view of superlattice 355 and sacrificial structure 307 shown in FIG. 3B. Superlattice 355 is etched back as described above, so that the remaining portion of superlattice 355 is in a GAA channel region 357, under sacrificial structure 307.

FIG. 4B is a magnified cross-sectional view illustrating GAA channel region 357 following formation of inner spacers 464 and epitaxial source/drain regions 170. FIG. 4B shows that inner spacers 464 are formed adjacent to nanostructured layers 322 in GAA channel region 357, before epitaxial source/drain regions 170 are grown laterally outward, in the x-direction, from nanostructured layers 321.

Figure 4D:
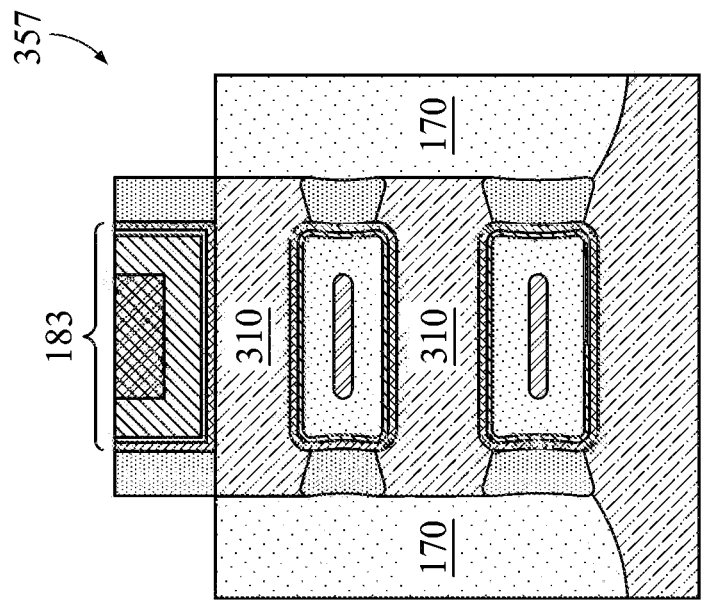
Figure 4C:
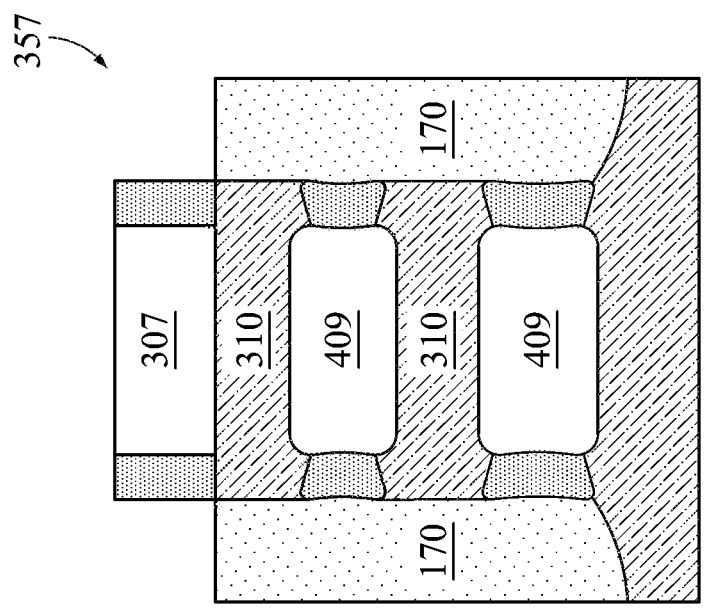

FIG. 4C is a magnified cross-sectional view illustrating GAA channel region 357, following extraction of nanostructured layers 322 and thus forming voids 409.

FIG. 4D is a magnified cross-sectional view illustrating GAA channel region 357, following replacement of sacrificial structure 307 with metal gate structure 183. Sacrificial structure 307 is removed, leaving sidewall spacers 128 in place. Metal gate structure 183 is formed in a multi-step process to replace sacrificial structure 307.

Figure 4E:
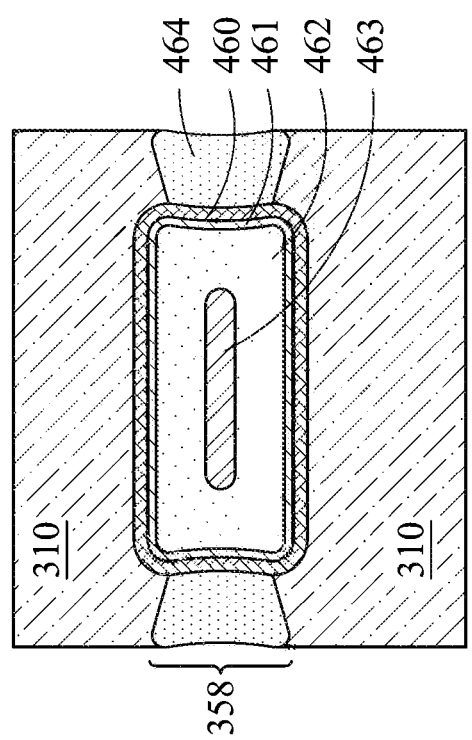

Referring to FIG. 4E, each GAA structure 358 can be viewed as a radial gate stack that includes, from the outermost layer to the innermost layer, an interfacial layer 460, a gate dielectric layer 461, a work function metal layer 462, and a gate electrode 463. Gate electrode 463 is operable to maintain a capacitive applied voltage across nanostructured channels 310. Gate dielectric layer 461 separates the metallic layers of GAA structure 358 from nanostructured channels 310. Inner spacers 464 electrically isolate GAA structure 358 from epitaxial source/drain region 170 and prevent current from leaking out of nanostructured channels 310. In some embodiments, inner spacers 464 can be made of silicon carbide nitride (SiCN). As gate structure 183 is formed, the radial gate stack is also formed to fill voids 409 from the outside in, starting with interfacial layer 460, and ending with gate electrode 463.

Interfacial layer 460 can be made of a silicon oxide and can be formed by deposition, chemical oxidation, or a thermal oxidation process. In some embodiments, interfacial layer 460 is a silicon oxide formed using ozone ($O_3$) with standard clean 1 (SC1) and standard clean 2 (SC2) wet clean processes. A thickness of interfacial layer 460 can be between about 5 Å to about 15 Å.

Gate dielectric layer 461 can have a thickness between about 1 nm and about 5 nm. Gate dielectric layer 461 can include a silicon oxide and can be formed by CVD, atomic layer deposition (ALD), physical vapor deposition (PVD), e-beam evaporation, or another suitable deposition process. In some embodiments, gate dielectric layer 461 includes a high-k material, wherein the term "high-k" refers to a high dielectric constant. In the field of semiconductor device structures and manufacturing processes, high-k refers to a dielectric constant that is greater than the dielectric constant of $SiO_2$ (e.g., greater than 3.9). In some embodiments, the high-k gate dielectric layer 461 can have a dielectric constant greater than about 7.0. In some embodiments, the dielectric layer can include a silicon oxide, silicon nitride, and/or silicon oxynitride material, or a high-k dielectric material, such as hafnium oxide ($HfO_2$). The high-k gate dielectric material can be conformally deposited by ALD and/or other deposition methods. In some embodiments, the gate dielectric layer can include a single layer or multiple insulating material layers.

Gate work function metal layer 462 can include a single metal layer or a stack of metal layers. The stack of metal layers can include metals having work functions similar to or different from each other. In some embodiments, the gate work function metal layer can include, for example, aluminum (Al), copper (Cu), tungsten (W), titanium (Ti), tantalum (Ta), cobalt (Co), titanium nitride (TiN), tungsten nitride (WN), molybdenum nitride (MoN), titanium aluminum (TiAl), titanium aluminum carbide (TiAlC), tantalum aluminum (TaAl), tantalum aluminum carbide (TaAlC), titanium aluminum nitride (TiAlN), other metal nitrides, metal silicides, metal alloys, and/or combinations thereof. The gate work function metal layer can be formed using a suitable process, such as ALD, CVD, PVD, plating, and combinations thereof. In some embodiments, the gate work function metal layer can have a thickness between about 2 nm and about 15 nm.

Gate electrode 463 can further include a gate metal fill layer. The gate metal fill layer can include a single metal layer or a stack of metal layers. The stack of metal layers can include metals different from each other. In some embodiments, the gate metal fill layer can include one or more suitable conductive materials or alloys, such as Ti, Al, TiN, W, Co, ruthenium (Ru), Mo, and iridium (Ir). The gate metal fill layer can be formed by ALD, PVD, CVD, or other suitable deposition process. Other materials, dimensions, and formation methods for gate dielectric layer 461, gate work function metal layer 462, and gate electrode 463 are within the scope and spirit of this disclosure.

Figure 5A:
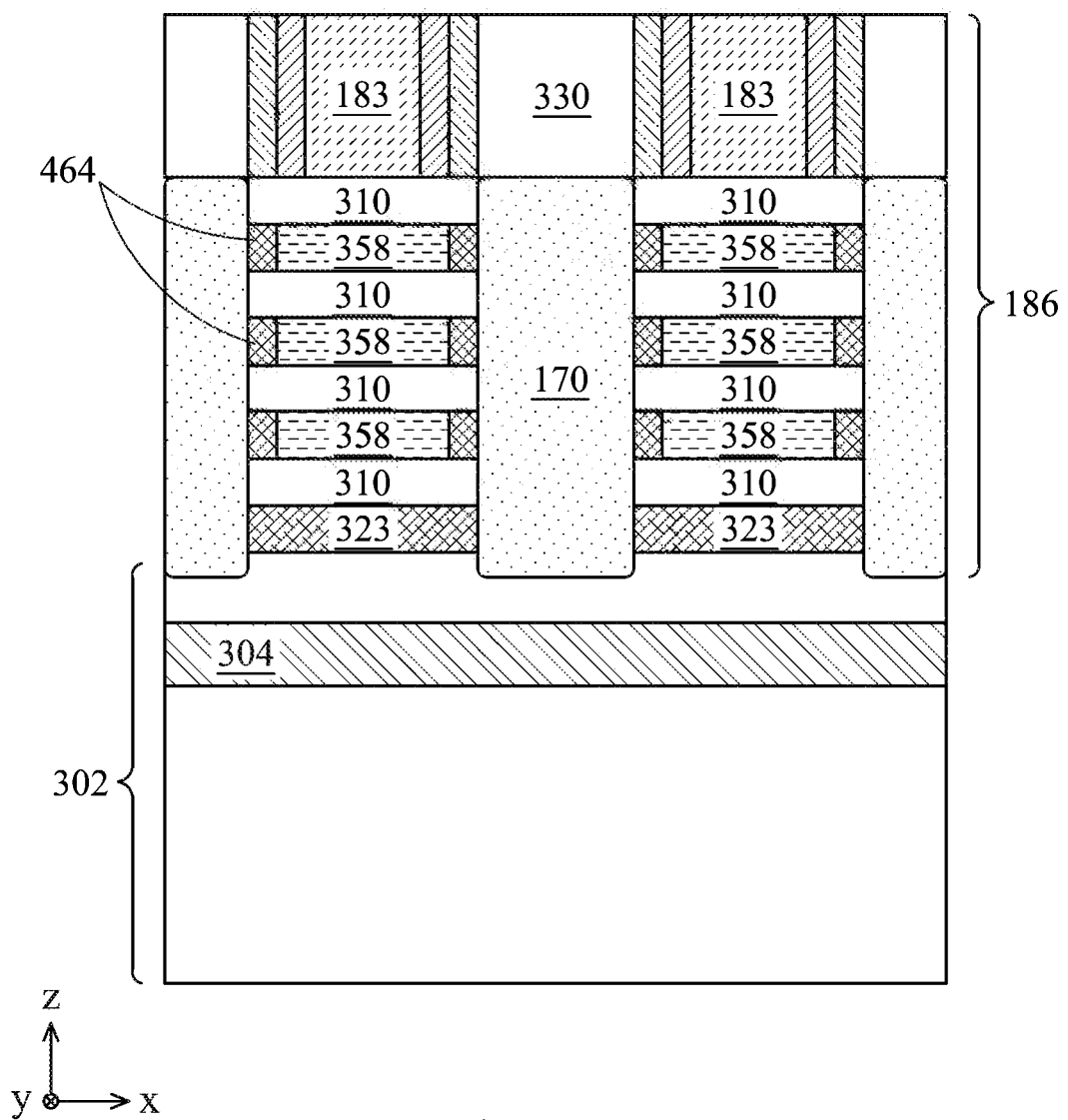
Figure 5B:
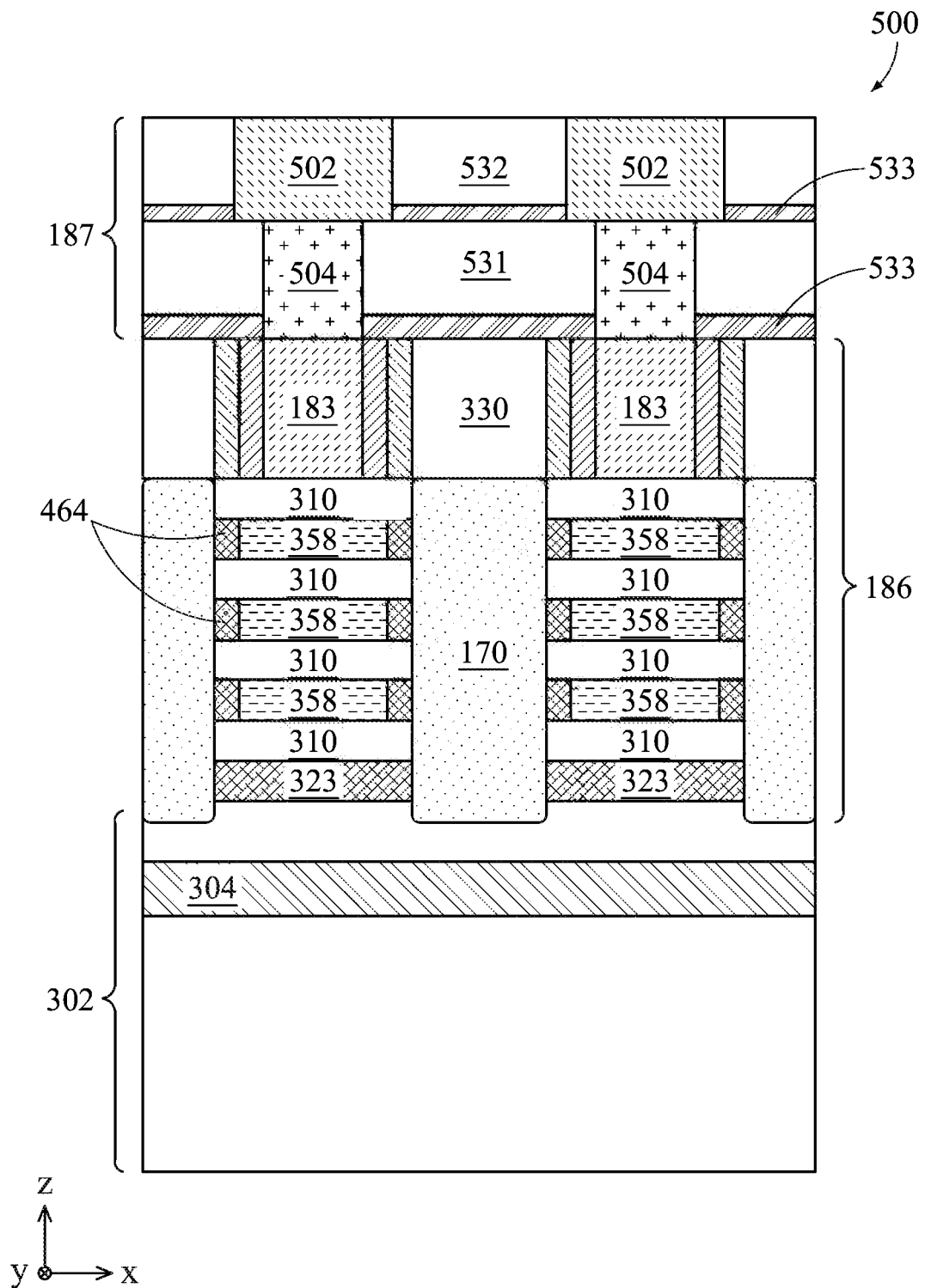
Figure 5C:
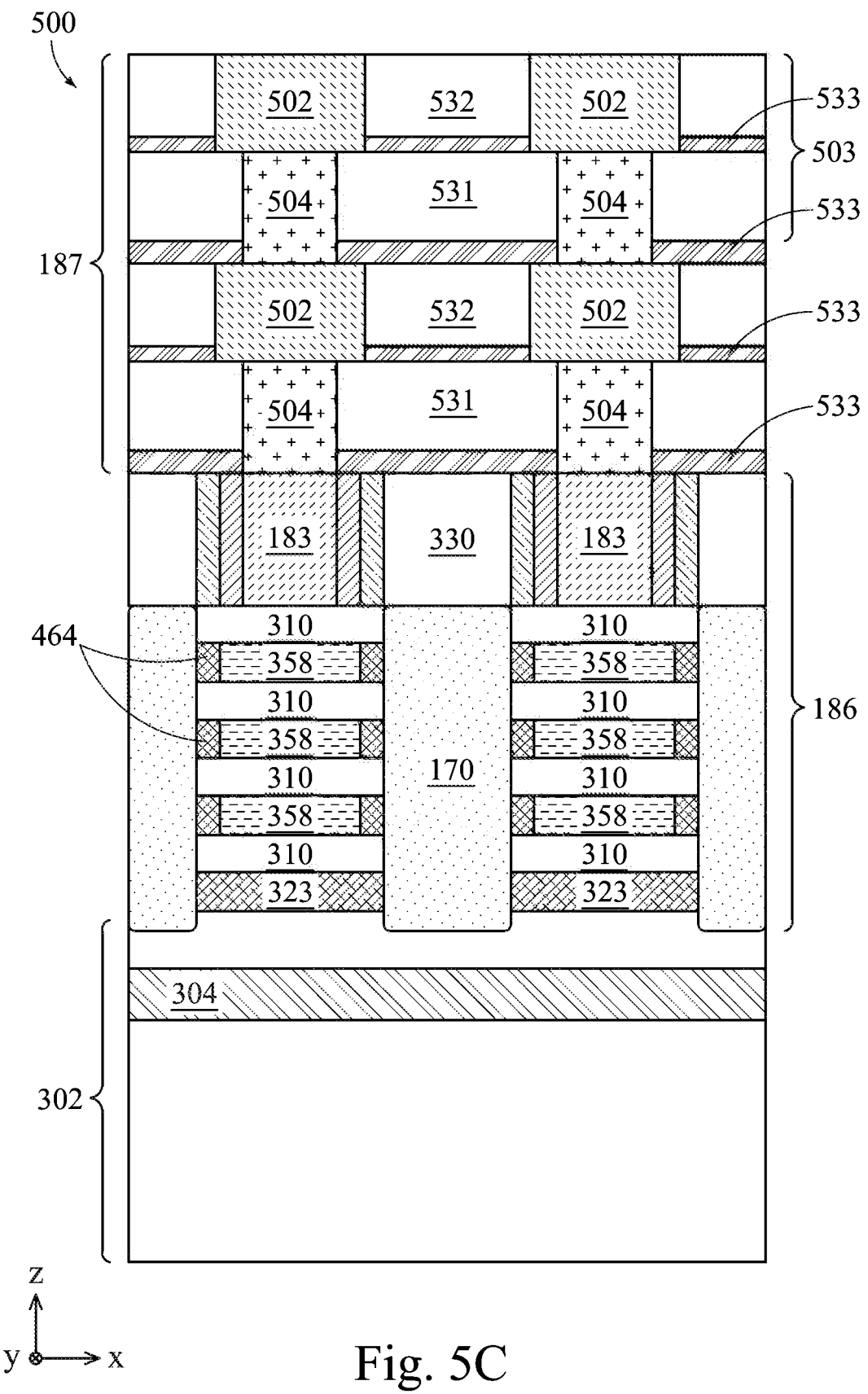

Referring to FIG. 2, in operation 204, an interconnect structure 187 is formed above transistor 186, to form a transistor assembly 500, as shown in FIGS. 5A-5C, according to some embodiments. Interconnect structure 187 provides electrical connections to respective gate terminals 183 of GAAFETs, including transistor 186. Interconnect structure 187 includes at least a first layer of metallization, for example, metal lines 502 coupled to gate structures 183 by tungsten gate contacts 504, as shown in FIG. 5B. Metal lines 502 can be in the form of copper wiring insulated by ILD layers 330, 531, and 532. ILD layers 330, 531, and 532 can be made of oxide (e.g., $SiO_2$) and can be formed on a base layer 533, made of silicon nitride (SiN). Spacers separating ILD 330 from gate terminals 183 can be made of silicon carbide nitride (SiCN). Interconnect structure 187 can be formed as a damascene structure in which the ILD is deposited, trenches are formed in the ILD by a plasma etching process, and the trenches are filled with copper using, for example, an electroplating process. Interconnect structure 187 can further include one or more additional metallization layers 503 formed in similar fashion as metal lines 502, and ILD layers 330, 531, and 532. A transistor assembly 501 that includes an exemplary additional metallization layer 503 to augment interconnect structure 187 is shown in FIG. 5C.

Figure 6A:
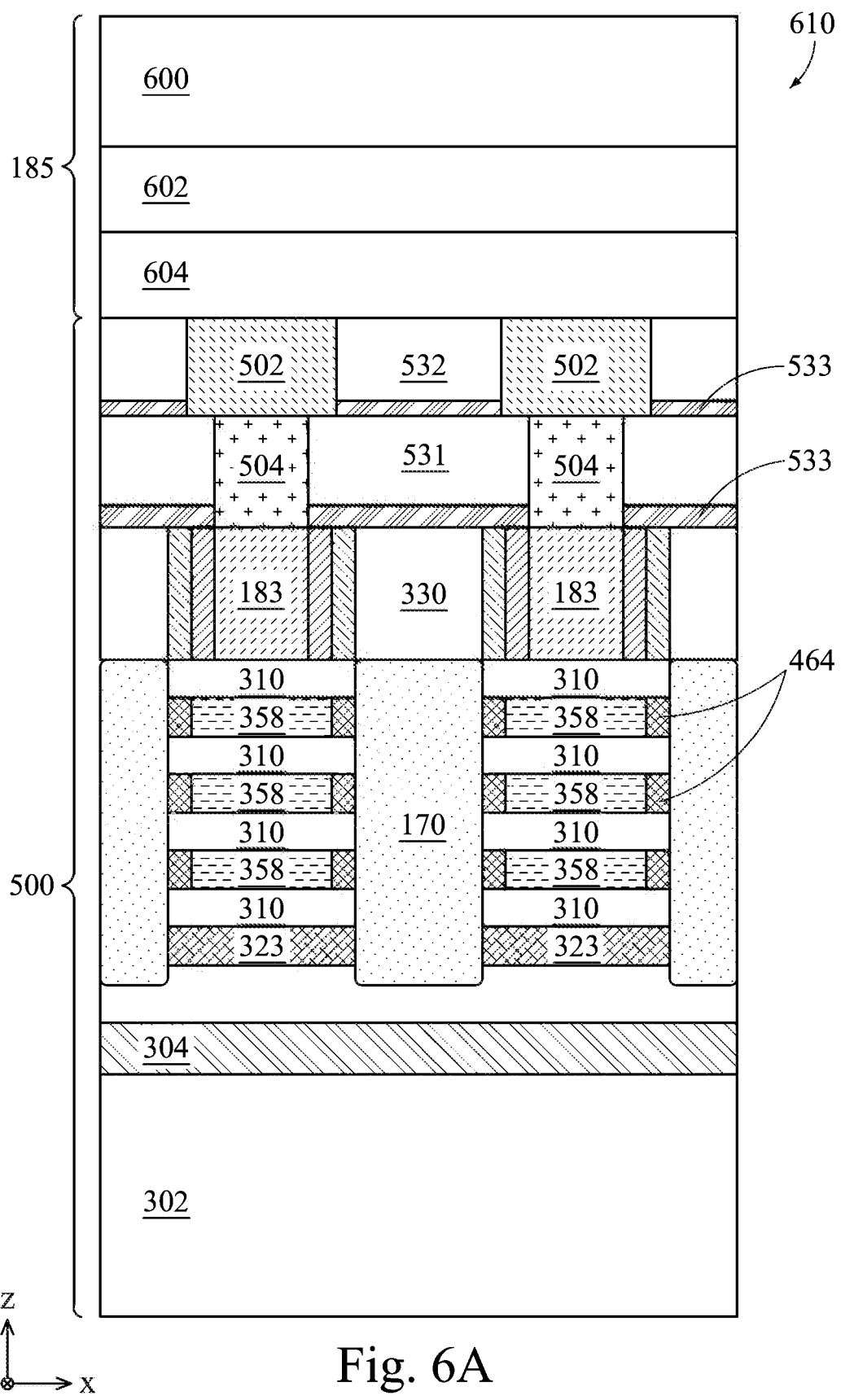

Referring to FIG. 2, in operation 206, an oxide is deposited onto interconnect structure 187 as a bond interface layer 604, as shown in FIG. 6A, according to some embodiments. Bond interface layer 604 can be an oxide deposited using a high density plasma (HDP) process, at a temperature between about 350° C. and about 450° C. The deposition process can use reaction gases including, for example, $SiH_4$, $N_2O$, and $O_2$, at a pressure between about 5 mTorr and about 20 mTorr, and a plasma power between about 4000 W and about 60,000 W. To improve its bond strength, bond interface layer 604 can be polished using a chemical-mechanical planarization (CMP) process so that a smooth surface is formed, having a surface roughness of less than about 300 Å.

Figure 6B:
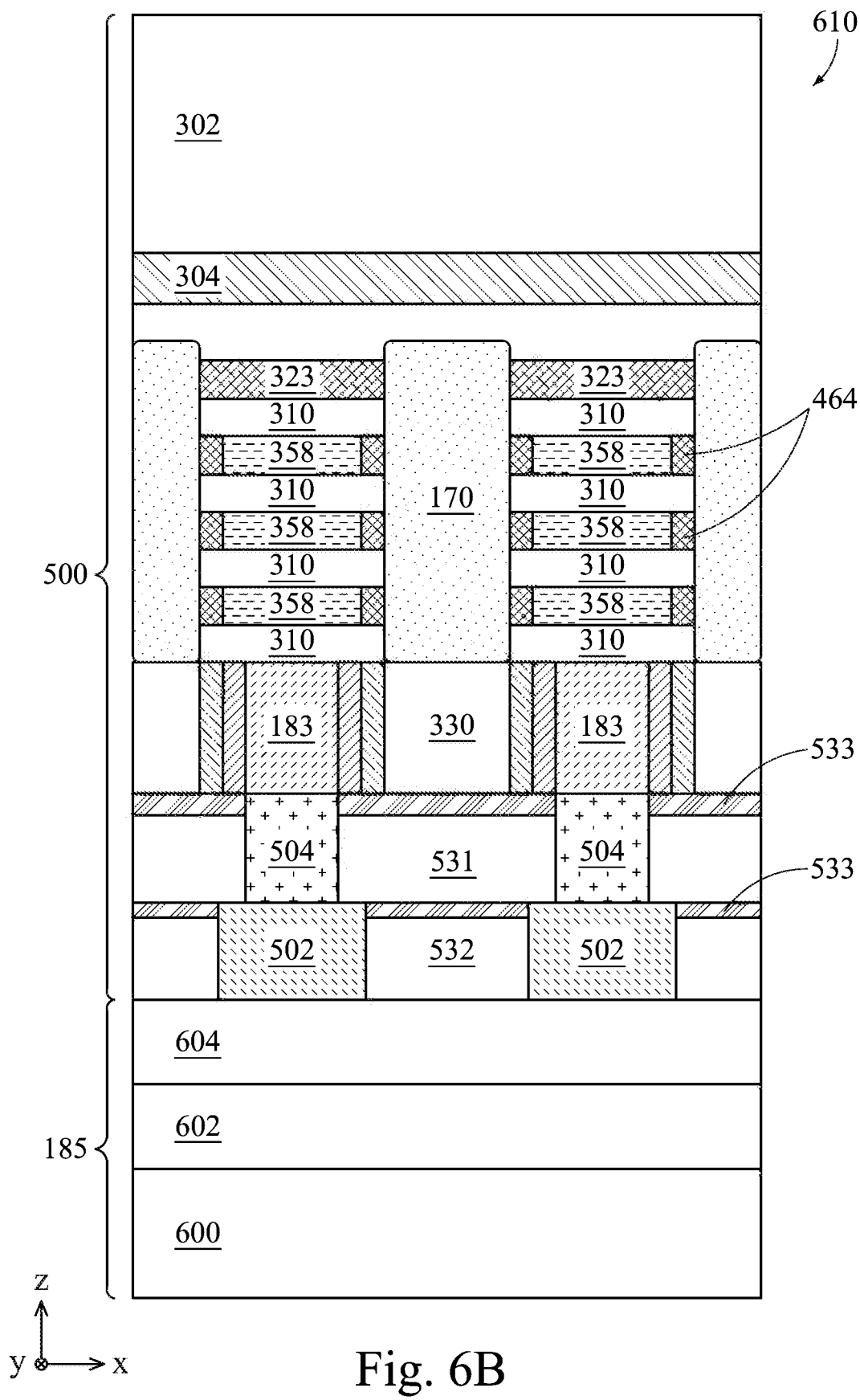

Referring to FIG. 2, in operation 208, transistor assembly 500 is bonded to a carrier wafer 600 to form bonded assembly 610 (or bonded structure 610), as shown in FIG. 6A. Bonded assembly 610 is inverted as shown in FIG. 6B, according to some embodiments, so that transistor 186 is overlying interconnect structure 187. Carrier wafer 600 can be a bare silicon wafer that includes a surface oxide layer 602. Surface oxide layer 602 can be a native oxide that forms on silicon. Alternatively, surface oxide layer 602 can be a grown oxide having a thickness of, for example, about 300 Å. The oxide-oxide bonding process can include a pre-treatment of either transistor assembly 500 or carrier wafer 600, or both. The pre-treatment can include, for example, a wet-clean in water to ensure OH radicals are present on one or both of the oxide surfaces being bonded. Following the pre-treatment, carrier wafer 600 is bonded to the front side of transistor assembly 500, at bond interface layer 604. Wafer on wafer (WOW) bonding can occur in a bonding tool. The bonding process can be followed by an anneal operation to ensure the bonding strength is high, in preparation for the formation of ferroelectric memory cell 180. Following the bonding operation, bonded assembly 610 is flipped upside down so that transistor 186 is oriented on top of interconnect 187. The remainder of the processing operations of FIG. 2, including fabricating the ferroelectric capacitor 188, occur on the back side of the original silicon wafer on which transistor assembly 500 was constructed.

Figure 7A:
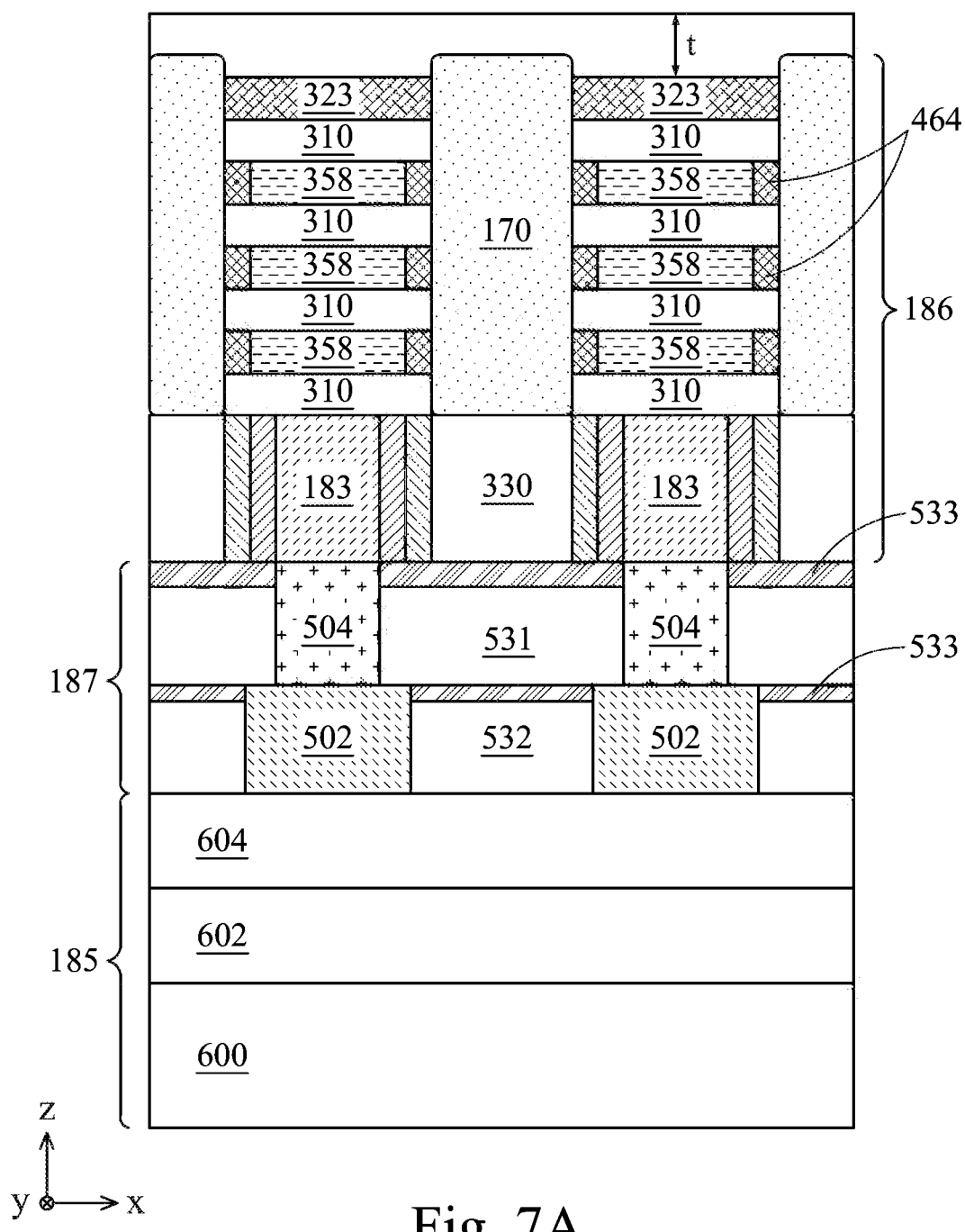
Figure 7B:
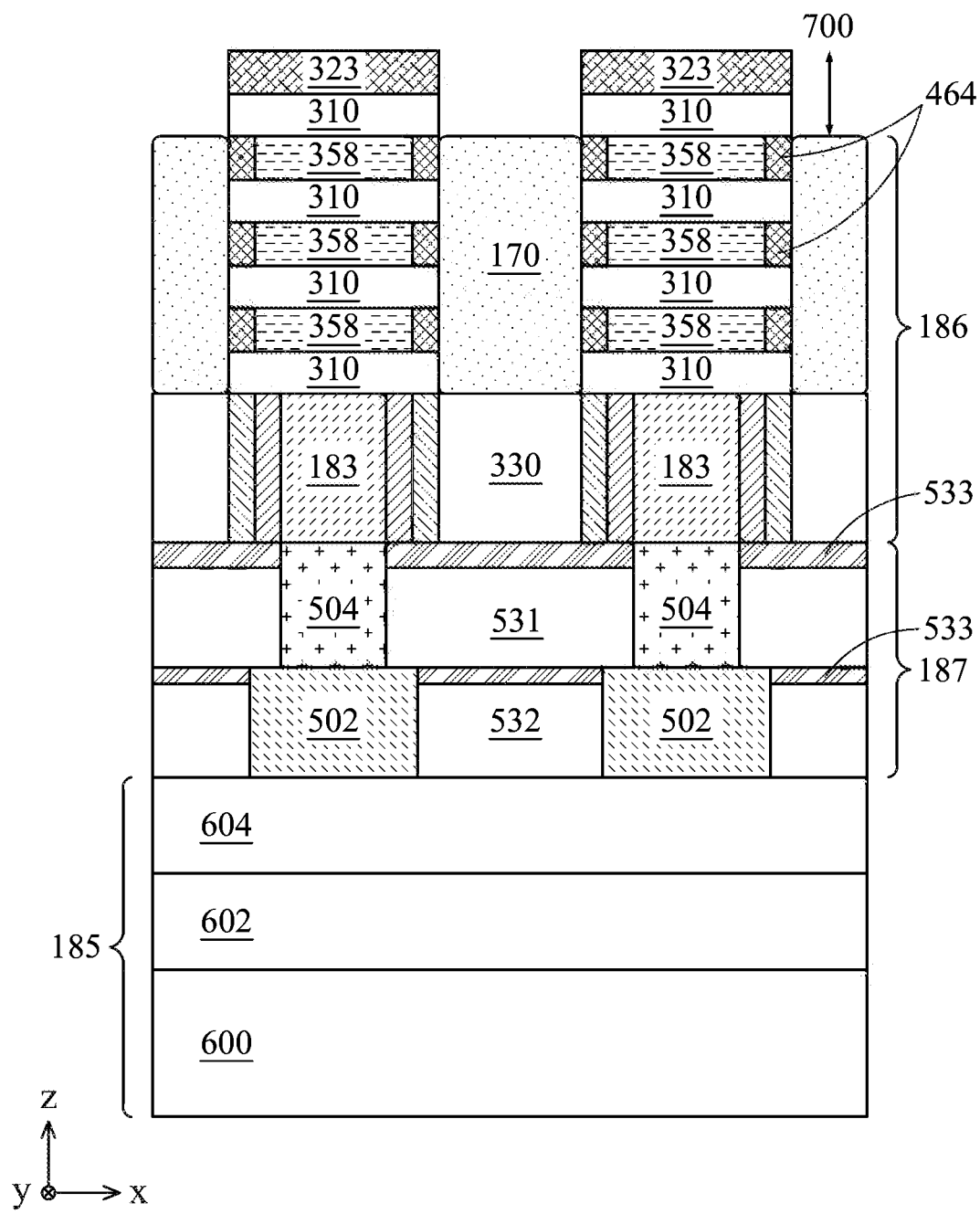

Referring to FIG. 2, in operation 210, substrate 302 is thinned to expose transistor source/drain regions 170, as shown in FIGS. 7A-7B, according to some embodiments. Substrate 302 is subjected to a grinding operation that reduces its thickness from about 100 μm to a thickness between about 5 μm to about 6 μm. The remaining silicon can be planarized in a CMP process, down to buried layer 304. Buried layer 304 is removed in a wet etch process that is selective to the silicon underlying buried layer 304 (e.g., hydrofluoric acid). Following oxide removal, the remaining silicon layer, as shown in FIG. 7A, has a thickness t of about 100 Å. Thus, almost all of the original silicon wafer is removed and will not be present in ferroelectric memory cell 180. Instead of being formed on silicon, the fully formed ferroelectric memory cell 180 is formed on carrier substrate 185. Referring to FIG. 7B, the remaining silicon is removed to expose the source/drain region 170, which can be made of epitaxial SiGe. Source/drain regions 170 are recessed by a recess distance 700, while silicon nitride layer 323 serves as a hard mask protecting the gate region of transistor 186. Recess distance 700 can be between about 20 nm and about 50 nm. The source/drain recess operation can be accomplished by a timed plasma etch-back operation using an anisotropic etch chemistry, so that the SiGe is removed without laterally etching sidewalls of the silicon layer under the hard mask. Alternatively, the source/drain recess can be accomplished using a wet etch chemistry, such as DHF and APM.

Figure 8A:
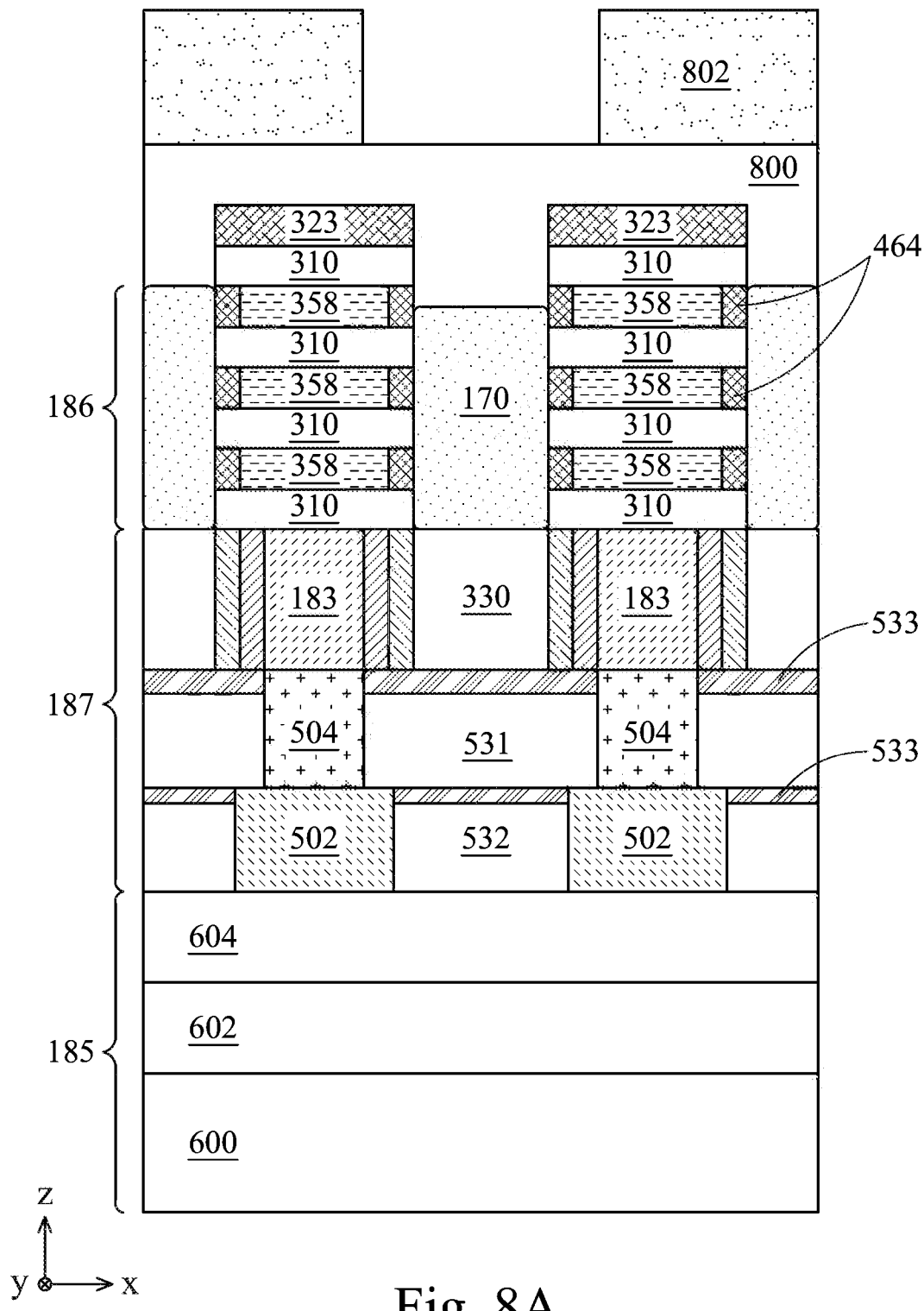
Figure 8B:
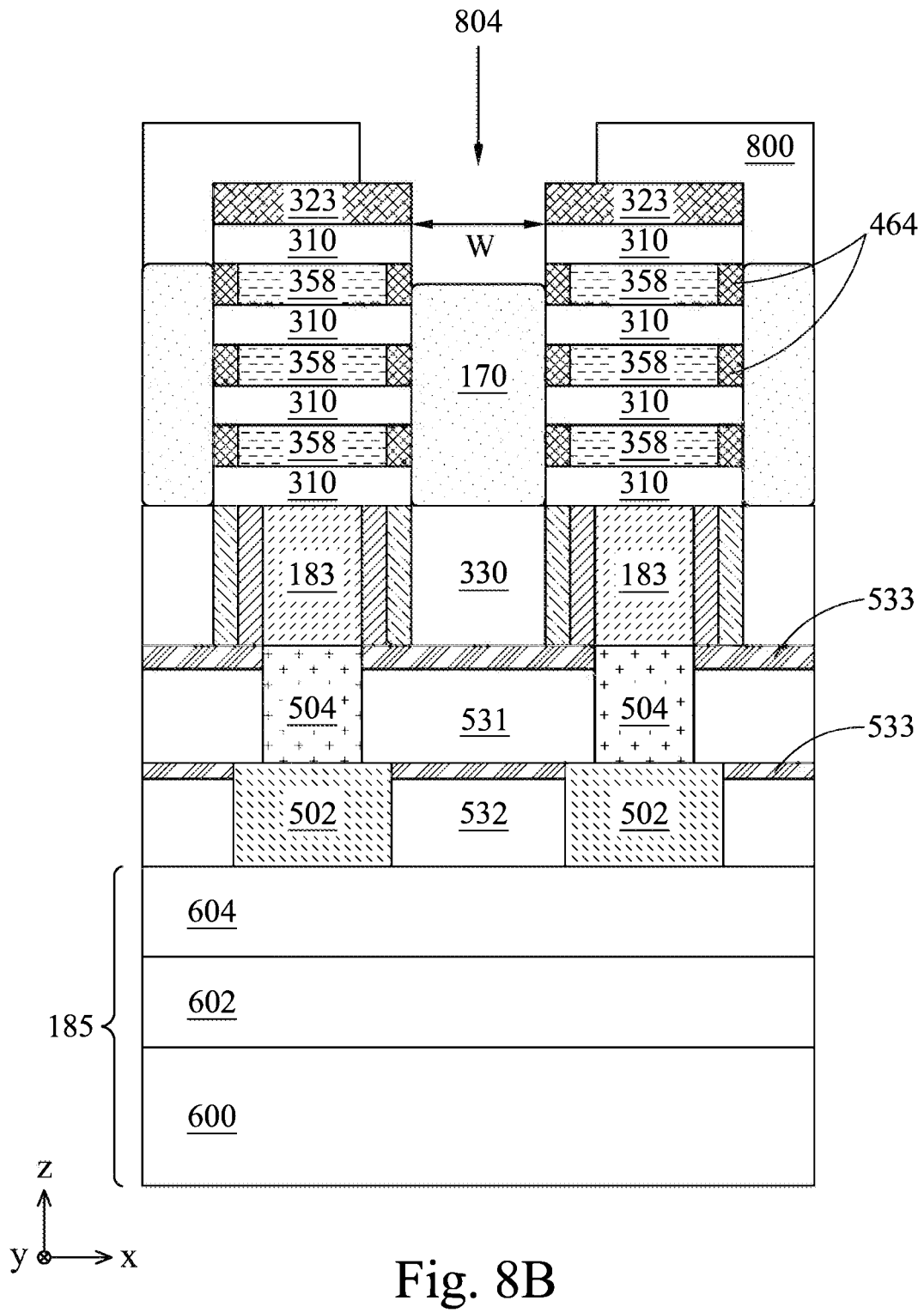
Figure 8C:
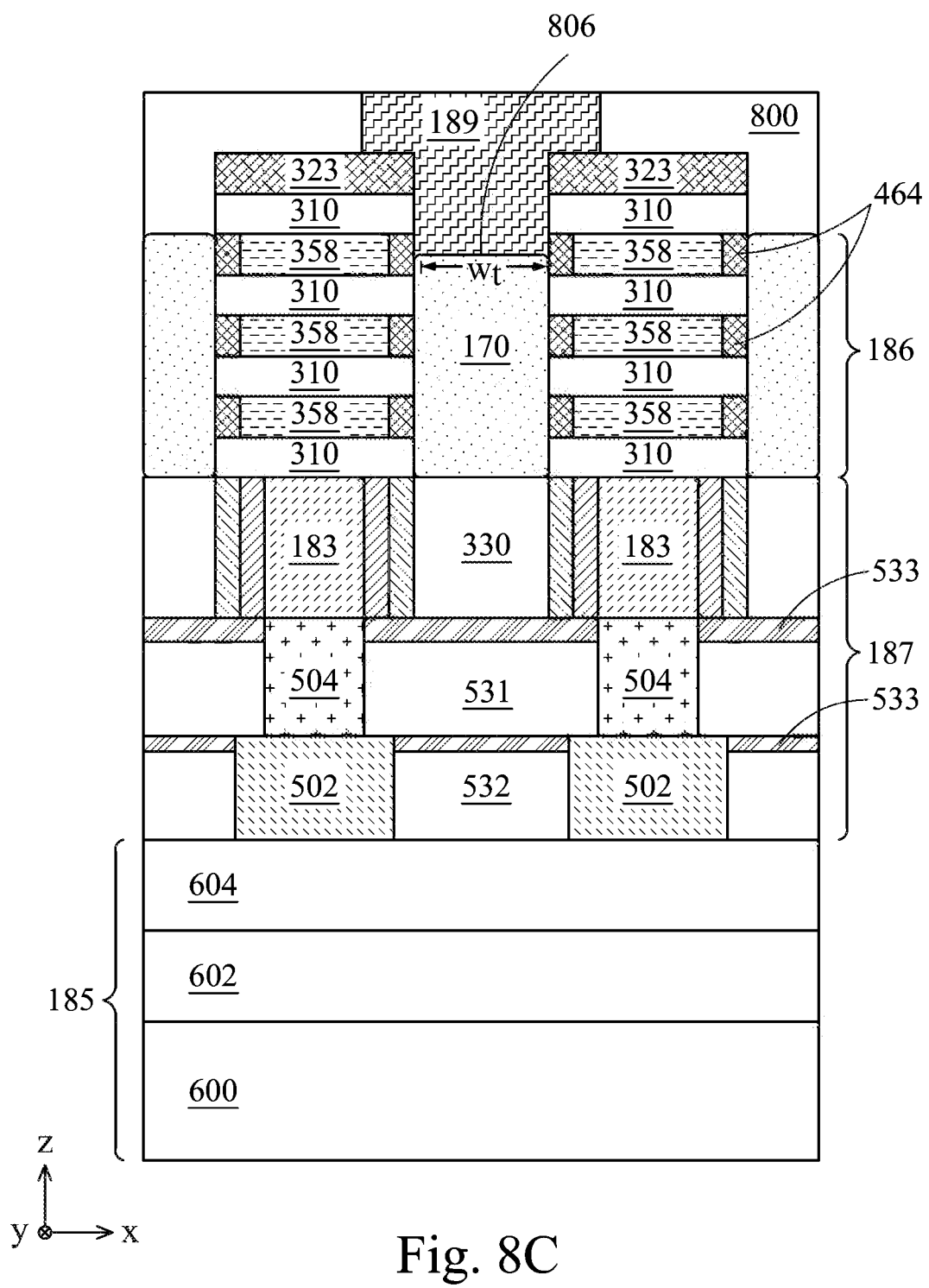

Referring to FIG. 2, in operation 212, backside source/drain contact 189 can be formed as shown in FIGS. 8A-8C, according to some embodiments. An insulating layer 800 can be deposited over the recessed SiGe source/drain regions 170 and SiN layer 323. Insulating layer 800 can be a low-k silicon oxide that can include carbon. Insulating layer 800 can be patterned using a hard mask 802 that is in turn patterned with a photoresist mask, as shown in FIG. 8A. A T-shaped via 804, shown in FIG. 8B, can be etched into insulating layer 800 using a via etch chemistry (e.g., a fluorine-based anisotropic plasma etch that removes oxide) selective to SiN and silicon.

Following formation of T-shaped via 804, hard mask 802 is removed, and T-shaped via 804 is filled with metal to form backside source/drain contact 189 having a T-shape, as shown in FIG. 8C. T-shaped backside source/drain contact 189 can have a bottom width, $w_t$, between about 20 nm and about 40 nm, which is about half the top width of T-shaped backside source/drain contact 189. Backside source/drain contact 189 couples to shared source/drain region 170 at an interface 806, which can include a contact silicide (e.g., titanium silicide (TiSi), nickel silicide (NiSi), and cobalt silicide (CoSi)). Interface 806 can be formed by performing a pre-clean and filling via 804 with a liner made of, for example, titanium. The titanium can be deposited using, for example, PVD or CVD, followed by a titanium nitride (TiN) deposition using CVD. The liner can be annealed to react the titanium with a silicon component of the underlying SiGe material, to form the contact silicide. The anneal process can be a rapid thermal anneal (RTA) at a temperature of about 575° C. for about 15 seconds, to achieve a titanium silicide (TiSi) thickness between about 4 nm and about 6 nm. Another pre-clean step can be performed prior to filling via 804. A low-resistivity bulk metal, such as tungsten (W), ruthenium (Ru), molybdenum (Mo), and iridium (Ir), is grown or deposited to fill via 804. Backside source/drain contact 189 can undergo a CMP process to be made co-planar with insulating layer 330.

Figure 9A:
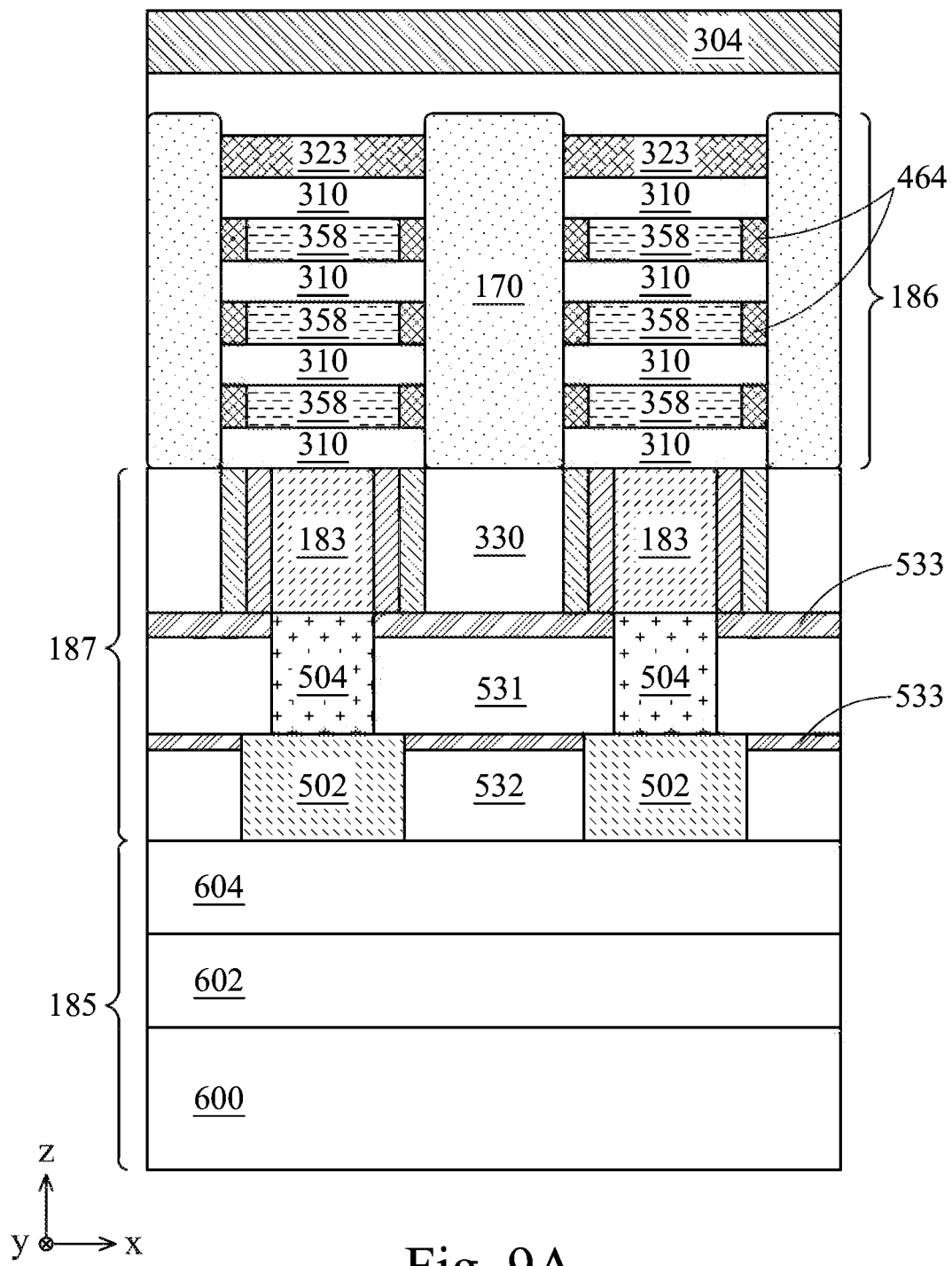
Figure 9B:
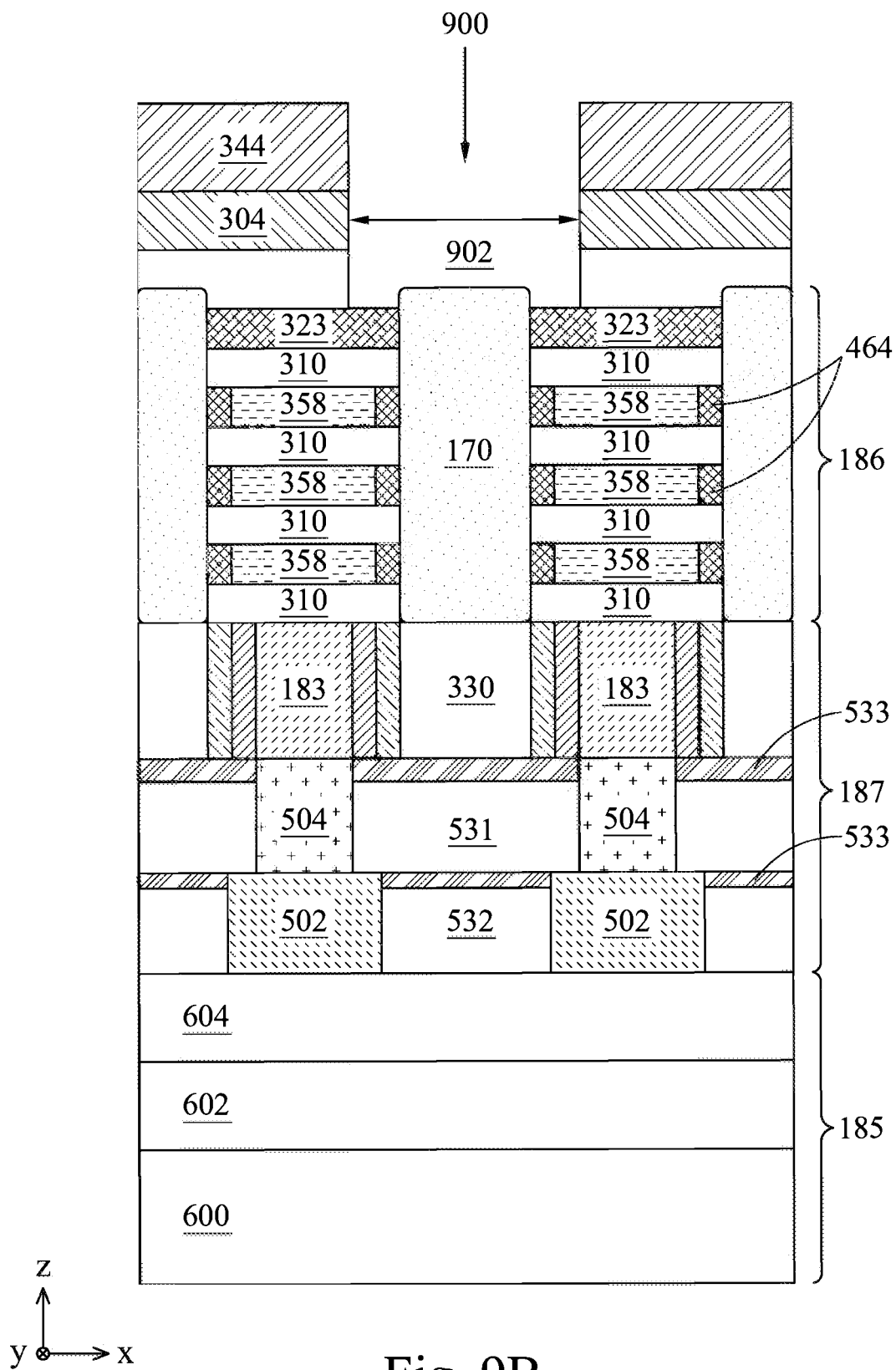
Figure 9C:
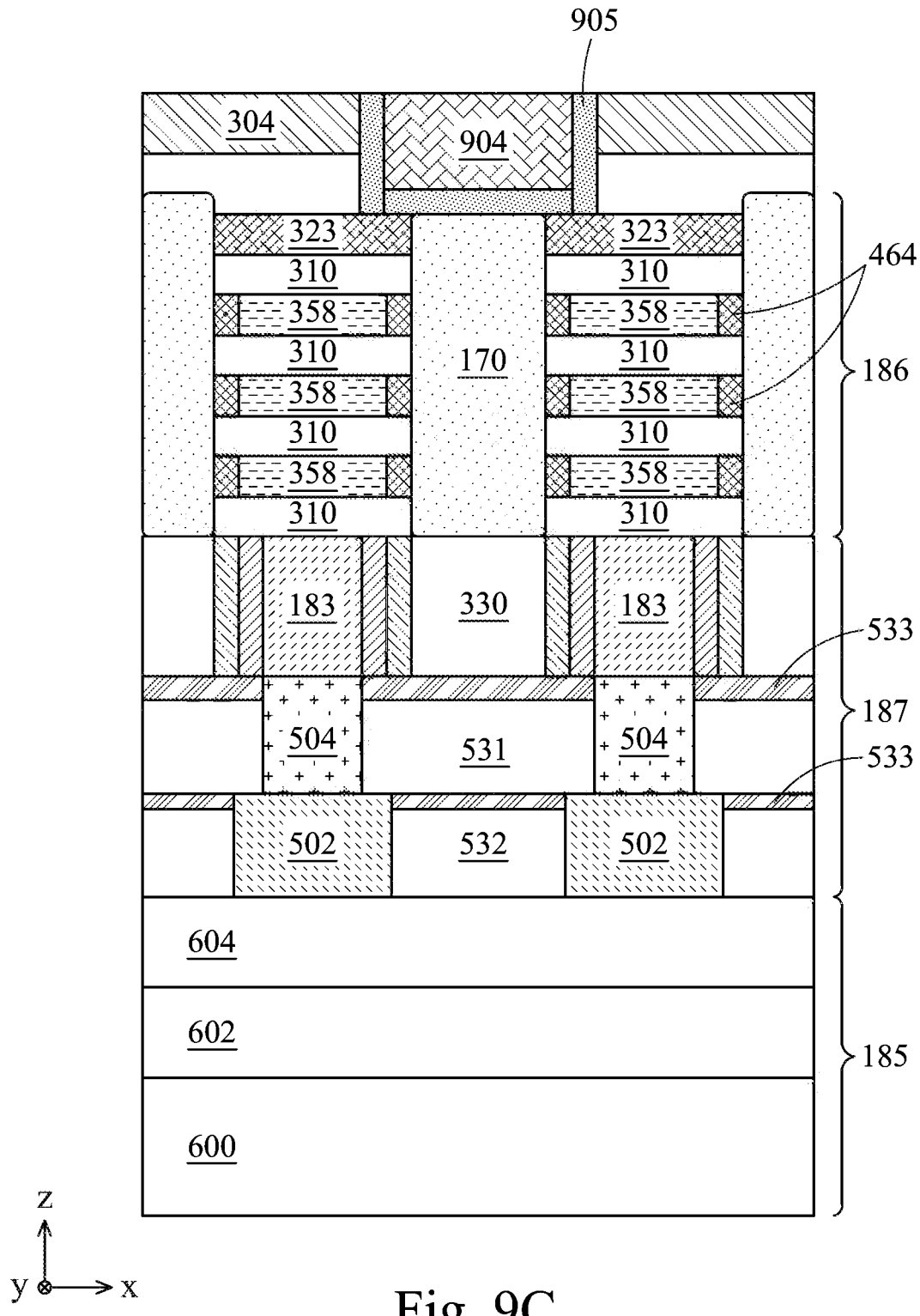

FIGS. 9A-9C illustrate an alternative method of fabricating a backside source/drain contact 904, which has similar materials, but a different shape than T-shaped backside source/drain contact 189. Referring to FIG. 9A, in operation 210, instead of removing all of substrate 302 and buried layer 304, and depositing insulating layer 330, the grinding process used to thin substrate 302 stops on buried layer 304. Buried layer 304 and the underlying silicon can be used as inter-layer dielectrics in place of the low-k oxide of insulating layer 330. Referring to FIG. 9B, buried layer 304 and the underlying silicon can be patterned using photolithography with a hard mask 344 to create via 900 as described above. In some embodiments, an opening 902 of via 900 is about 40 nm to about 100 nm wide, and via 900 can have an aspect ratio (height/width) between about 3 and about 10. Referring to FIG. 9C, via 900 can be filled with a low-resistivity metal to form backside source/drain contact 904. Backside source/drain contact 904 may include a conformal liner 905, made of, for example, titanium, cobalt, or nickel. The portion of liner 905 that contacts shared source/drain region 170 may react with a silicon component of shared source/drain region 170, thereby consuming a surface layer of source/drain region 170 to form a silicide in a similar way as described above for backside source/drain contact 189. Following deposition of the low-resistivity bulk metal, backside source/drain contact 904 can undergo a CMP process to be made co-planar with buried layer 304.

Using either T-shaped backside source/drain contact 189, or backside source/drain contact 904, the connection between transistors 186 and ferroelectric capacitor 188 is made directly. Therefore, signals propagating within ferroelectric memory cell 180 traverse a shorter distance than in ferroelectric memory cells in which both the transistor and the capacitor are formed on the front side of the wafer. Consequently, RC delays associated with ferroelectric memory cell 180 can be reduced, due to its more compact, stacked design, compared with RC delays of conventional memory cells where signals must traverse a larger distance. Reduced RC delays can result in enhanced performance of ferroelectric memory cell 180 compared with a conventional front side implementation.

Figure 10:
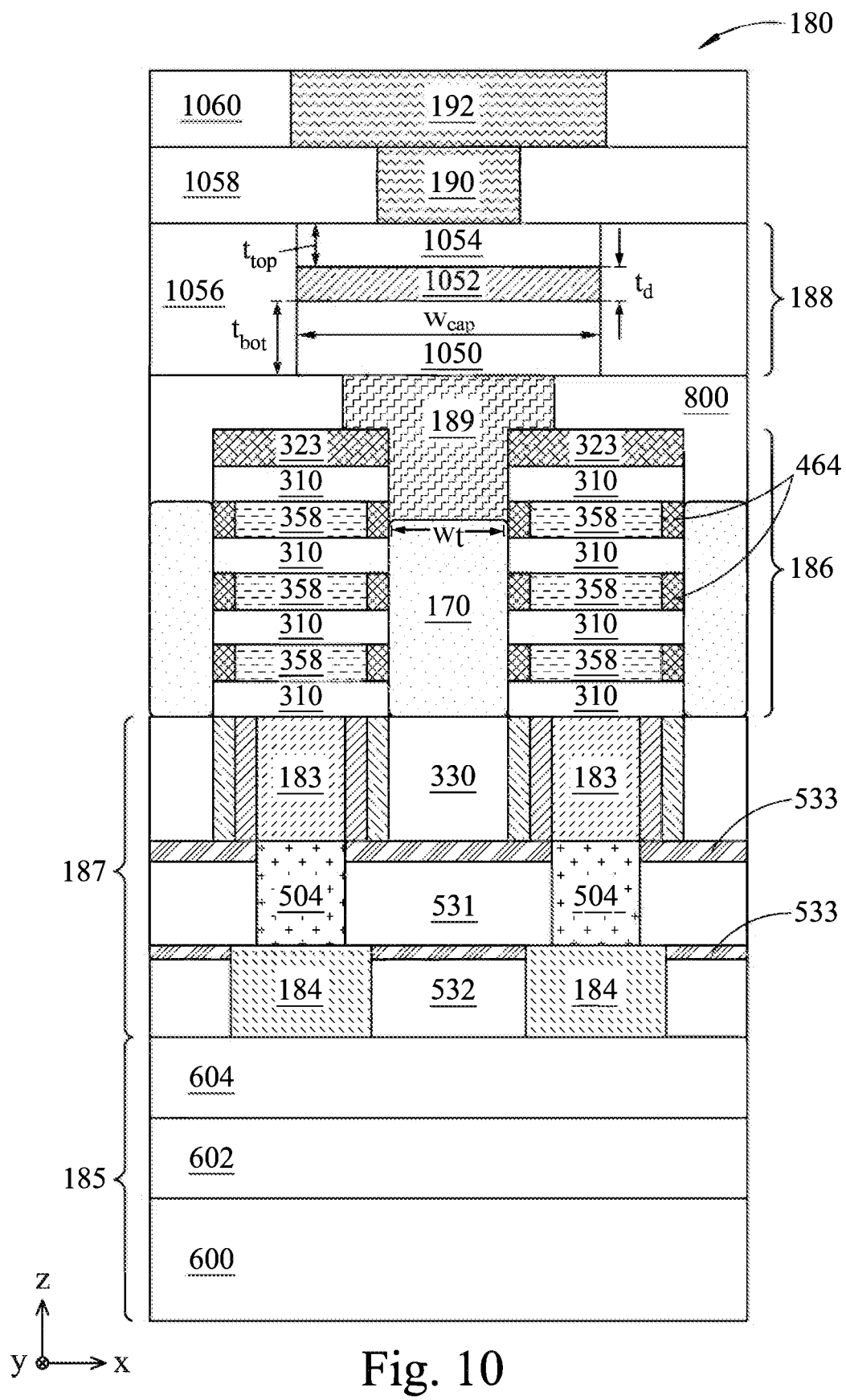

Referring to FIG. 2, in operation 214, an embedded ferroelectric capacitor 188 is formed on the back side of bonded assembly 610, as shown in FIG. 10, according to some embodiments. Ferroelectric capacitor 188 is a parallel plate capacitor that includes a bottom electrode 1050 made of a ferroelectric material, a top electrode 1054, and a dielectric 1052 disposed between the bottom and top electrodes. To form ferroelectric capacitor 188, an inter-layer dielectric 1056 can be deposited, patterned, and etched to form a via. The via can be partially filled with a ferroelectric material to form bottom electrode 1050 (e.g., lead zirconate titanate (PZT) or hafnium zirconium oxide ($HfZrO_2$), of which the Zr content can be in the range of about 30% to about 60%), followed by dielectric 1052 (e.g., strontium ruthenium oxide ($SrRuO_3$)) having a thickness $t_d$ between about 3 nm to about 20 nm, and followed by top electrode 1054 (e.g., iridium oxide ($IrO_2$)). When the Zr content is outside the range of about 30% to about 60%, ferroelectric properties of ferroelectric capacitor 188 would be altered so that, for example, ferroelectric capacitor 188 may not retain its polarization when un-biased, which can compromise performance of ferroelectric memory cell 180. A thickness $t_d$ that is thinner than about 3 nm could lead to breakdown of the electric field between the capacitor plates, potentially causing a short circuit. A thickness $t_d$ that is thicker than about 20 nm would reduce capacitance so that less charge is stored in ferroelectric capacitor 188. Top and bottom electrodes of ferroelectric capacitor 188 can each have a thickness, $t_{top}$ and $t_{bot}$, respectively, between about 70 nm to about 200 nm. The resulting ferroelectric capacitor 188 can have a width $w_{cap}$ between about 0.2 μm and about 0.8 μm. A width $w_{cap}$ less than about 0.2 μm would reduce the area of the capacitor plates, thus reducing the capacitance so that less charge is stored. A width $w_{cap}$ greater than about 0.8 μm would increase the area of the capacitor plates, potentially causing ferroelectric capacitor 188 to exceed the footprint of ferroelectric memory cell 180. A ratio of $w_{cap}/t_d$ for the ferroelectric capacitor 188 can be in the range of about 10-300. With respect to T-shaped backside source/drain contact 189, a ratio of contact area to capacitor plate area, $w_t/w_{cap}$, can be in the range of about 0.05-0.4.

In some embodiments, backside ferroelectric capacitors 188 can have a pitch between about 0.75 μm and about 2 μm. The pitch of ferroelectric capacitors 188 can be larger than a pitch associated with conventional front side ferroelectric capacitors, allowing backside ferroelectric capacitors 188 to be up to two times larger, and reducing the complexity of lithography operations for patterning ferroelectric capacitors 188. Larger capacitors can be advantageous in that they can store more charge, proportional to the area of the electrodes. Meanwhile, ferroelectric memory cell 180 can still benefit from high density transistors 186.

In some embodiments, a ferromagnetic or magneto-resistive RAM (MRAM) capacitor can be substituted for the ferroelectric capacitor 188. In an MRAM, the electrodes can be made of one or more ferromagnetic materials in place of the one or more ferroelectric materials described above. In some embodiments, a metal structure can be substituted for ferroelectric capacitor 188 to create a "power rail."

Referring to FIG. 2, in operation 216, backside metallization is formed as shown in FIG. 10, according to some embodiments. An inter-layer dielectric 1058 can be deposited, patterned, and etched to form a trench that can be filled with a metal (e.g., copper deposited by a plating process) to form a capacitor contact 190. Metallization 192 can be formed in ILD 1060, in similar fashion, and electrically coupled to a ground power supply (e.g., 0 V). Metal lines 502 are coupled to word line 184. Thus, ferroelectric capacitor 188 can be connected between the shared source/drain region 170 of transistor 186 and ground, consistent with circuit schematic of ferroelectric memory cell 180 as shown in FIG. 1A. Ferroelectric capacitor 188, coupled to transistor 186, completes the structure of ferroelectric memory cell 180.

Figure 11:
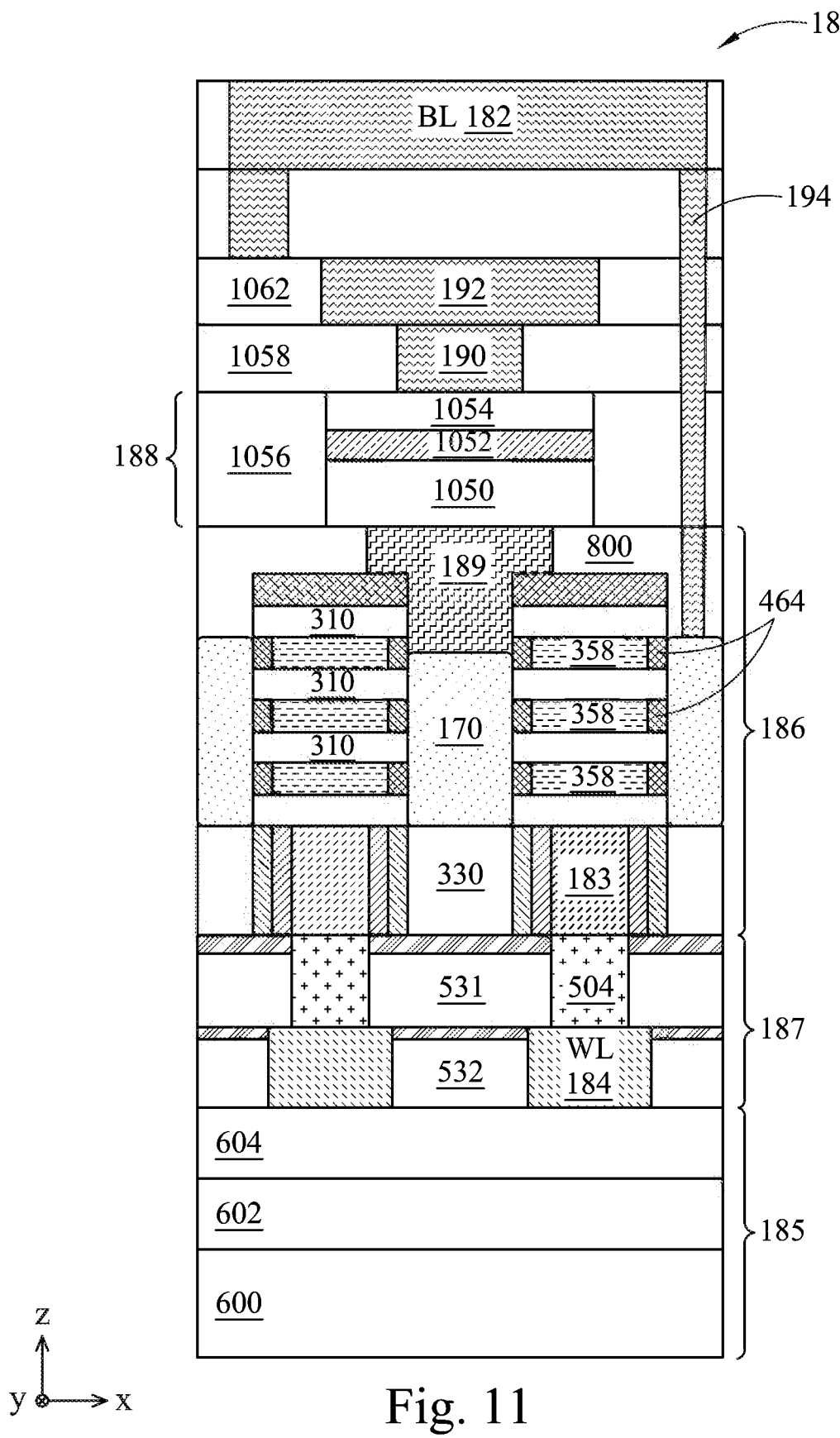

Referring to FIG. 2, in operation 218, a through-oxide via (TOV) 194 is routed between backside metallization coupled to bit line 182 and the drain/source region of transistor 186, as shown in FIGS. 1B and 11, according to some embodiments. The metallization process (e.g., damascene metallization) can continue above metallization 192 to form another layer of metal that couples to bit line 182. TOV 194 can be formed by etching a via (e.g., a tapered via) through multiple insulating layers to connect with the drain/source region of transistor 186, and filling the tapered via with metal (e.g., copper) to connect with bit line 182. In some embodiments, a tapered TOV 194 has an aspect ratio of in the range of about 15:1 to about 25:1. A lower portion of TOV 194 can further include a diffusion barrier and/or a silicided contact to drain/source region 170 that includes an intervening metal. TOV 194 completes the circuit connections, as shown in FIG. 1A, that can couple ferroelectric memory cell 180 to neighboring devices (e.g., other FeRAM cells in a memory array).

A ferroelectric memory cell (e.g., FeRAM) as disclosed herein includes a transistor formed on one side of a substrate, integrated with a ferroelectric capacitor formed on an opposite side of the substrate. A carrier wafer can be bonded to the transistor to allow the transistor and its associated interconnect structure to be inverted so that the capacitor can be electrically coupled from a back side of the substrate. A low-resistance contact between the transistor and the capacitor may have a rectangular shape or a T-shape, depending on the type of contact process that is used.

In some embodiments, a FeRAM includes: a substrate; an interconnect structure bonded to the substrate via a bond interface layer; a field effect transistor (FET) on top of the interconnect structure and electrically coupled to the interconnect structure via a gate contact; a capacitor on the FET; a source/drain contact electrically coupling the capacitor to a source/drain region of the FET; and a ground contact to the capacitor.

In some embodiments, a method includes: forming a transistor structure on a substrate; bonding a carrier wafer to the transistor structure to form a bonded structure; inverting the bonded structure; thinning the substrate to expose the transistor structure on a back side of the bonded structure; and coupling a capacitor to the transistor structure on the back side of the bonded structure.

In some embodiments, a FeRAM cell includes: first and second transistors on a first side of a substrate and sharing a source/drain region; an interconnect structure coupled to respective gate terminals of the first and second transistors; a ferroelectric capacitor formed on a second side of the substrate and electrically coupled to the shared source/drain region via a source/drain contact; and a ground contact electrically coupled to the ferroelectric capacitor.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A memory cell of a memory array, comprising:
   a substrate;
   an interconnect structure bonded to the substrate via a bond interface layer, the interconnect structure coupled to a word line of the memory array;
   a field effect transistor (FET) on top of the interconnect structure and electrically coupled to the interconnect structure via a gate contact;
   a ferroelectric capacitor on the FET;
   a source/drain contact electrically coupling the ferroelectric capacitor to a source/drain region of the FET; and
   a ground contact to the ferroelectric capacitor.

2. The memory cell of claim 1, wherein the ferroelectric capacitor comprises an electrode that includes iridium oxide.

3. The memory cell of claim 1, wherein the source/drain region of the FET is physically coupled to the ferroelectric capacitor.

4. The memory cell of claim 1, wherein the ferroelectric capacitor comprises one or more of lead zirconate titanate (PZT) and hafnium zirconium oxide ($HfZrO_2$).

5. The memory cell of claim 1, wherein the ferroelectric capacitor comprises a dielectric that includes strontium ruthenium oxide ($SrRuO_3$).

6. The memory cell of claim 1, wherein the FET comprises a gate-all-around (GAA) FET.

7. The memory cell of claim 1, wherein the source/drain contact comprises one or more of tungsten (W), ruthenium (Ru), molybdenum (Mo), and iridium (Ir).

8. A method, comprising:
forming a transistor structure on a substrate;
bonding a carrier wafer to the transistor structure to form a bonded structure;
inverting the bonded structure;
thinning the substrate to expose the transistor structure on a back side of the bonded structure; and
coupling a ferroelectric capacitor to the transistor structure on the back side of the bonded structure to form a ferroelectric memory cell (FeRAM).

9. The method of claim 8, further comprising:
forming an interconnect structure to electrically contact to a gate terminal of the transistor structure.

10. The method of claim 8, further comprising:
forming a T-shaped back side source/drain contact that electrically couples a first electrode of the ferroelectric capacitor to a source/drain region of the transistor structure; and
forming metal lines that electrically couple to a second electrode of the ferroelectric capacitor.

11. The method of claim 10, further comprising forming a through-oxide via to make contact with an other source/drain region of the transistor structure.

12. The method of claim 8, wherein bonding the carrier wafer to the transistor structure comprises forming a bond interface layer on the carrier wafer.

13. The method of claim 12, wherein forming the bond interface layer comprises forming an oxide in a high density plasma.

14. The method of claim 13, wherein forming the bond interface layer further comprises planarizing the oxide.

15. The method of claim 8, wherein forming the transistor structure comprises forming a nano-sheet gate-all-around (GAA)FET.

16. The method of claim 15, wherein forming the GAAFET comprises forming epitaxial source/drain regions.

17. A ferroelectric memory cell (FeRAM), comprising:
a pair of transistors on a front side of a substrate and sharing a source/drain region;
an interconnect structure coupled to respective gate terminals of the transistors;
a ferroelectric capacitor formed on a back side of the substrate and electrically coupled to the shared source/drain region via a source/drain contact;
a through-oxide via (TOV) coupled to one of the pair of transistors; and
a ground contact electrically coupled to the ferroelectric capacitor.

18. The FeRAM of claim 17, further comprising a carrier wafer bonded to the interconnect structure to form a bonded structure.

19. The FeRAM of claim 18, wherein the bonded structure includes a bond interface layer made of a silicon oxide material.

20. The FeRAM of claim 17, wherein the pair of transistors comprise one or more of FinFETs, planar FETs, and GAAFETs.

* * * * *